(12) United States Patent
Wakizaka et al.

(10) Patent No.: US 7,614,145 B2
(45) Date of Patent: Nov. 10, 2009

(54) METHOD FOR MANUFACTURING MULTILAYER CIRCUIT BOARD AND RESIN BASE MATERIAL

(75) Inventors: Yasuhiro Wakizaka, Tokyo (JP); Koichi Ikeda, Tokyo (JP); Naoki Kanda, Tokyo (JP)

(73) Assignee: Zeon Corporation, Tokyo (JP)

( * ) Notice: Subject to any disclaimer, the term of this patent is extended or adjusted under 35 U.S.C. 154(b) by 528 days.

(21) Appl. No.: 10/487,997

(22) PCT Filed: Sep. 4, 2002

(86) PCT No.: PCT/JP02/08976

§ 371 (c)(1),
(2), (4) Date: Feb. 27, 2004

(87) PCT Pub. No.: WO03/024174

PCT Pub. Date: Mar. 20, 2003

(65) Prior Publication Data

US 2004/0237295 A1 Dec. 2, 2004

(30) Foreign Application Priority Data

| Sep. 5, 2001 | (JP) | 2001-268847 |
| Feb. 28, 2002 | (JP) | 2002-054808 |
| Jul. 26, 2002 | (JP) | 2002-217513 |

(51) Int. Cl.
  H05K 3/38 (2006.01)
  H05K 3/46 (2006.01)

(52) U.S. Cl. .......... 29/846; 29/847; 174/259; 427/97.6; 427/99.2; 427/340; 427/384

(58) Field of Classification Search .......... 29/830, 29/846–851; 427/97.1, 97.6–97.8, 99.2, 427/340, 384; 174/256, 258, 259
See application file for complete search history.

(56) References Cited

U.S. PATENT DOCUMENTS 4,396,679 A * 8/1983 Gaku et al. .......... 428/412

(Continued)

FOREIGN PATENT DOCUMENTS

EP 0 257 737 A2 3/1988

(Continued)

OTHER PUBLICATIONS

Machine Translation of JP07-245467.*

*Primary Examiner*—A. Dexter Tugbang
*Assistant Examiner*—Livius R Cazan
(74) *Attorney, Agent, or Firm*—Birch, Stewart, Kolasch & Birch, LLP

(57) ABSTRACT

A curable resin composition layer (3) containing an insulating resin and a curing agent is formed on the surface of an inner layer board having an electrical insulating layer (1) with a conductor circuit (2) formed on the surface, so as to cover said conductor circuit. A compound (4) having a structure capable of coordinating to metal atoms or metal ions is brought into contact with the surface of the curable resin composition layer. An electrical insulating layer (7) is formed by curing the curable resin composition layer. A metallic thin film layer (8) is formed on the surface of the electrical insulating layer. A conductor circuit (9) is formed on the surface of the electrical insulating layer utilizing the metallic thin film layer. A multilayer circuit board is manufactured through these steps.

20 Claims, 1 Drawing Sheet

U.S. PATENT DOCUMENTS

| | | | | |
|---|---|---|---|---|
| 4,597,828 A | * | 7/1986 | Tadros | 216/20 |
| 5,468,597 A | | 11/1995 | Calabrese et al. | |
| 5,519,177 A | | 5/1996 | Wang et al. | 174/259 |
| 5,589,255 A | * | 12/1996 | Enomoto et al. | 442/149 |
| 6,001,488 A | * | 12/1999 | Kataoka et al. | 428/447 |
| 6,156,385 A | | 12/2000 | Takagi et al. | 427/306 |
| 6,248,428 B1 | * | 6/2001 | Asai et al. | 428/206 |
| 6,261,671 B1 | | 7/2001 | Asai et al. | 428/206 |

FOREIGN PATENT DOCUMENTS

| | | |
|---|---|---|
| JP | 7-131135 A | 5/1995 |
| JP | 7-245467 A | 9/1995 |
| JP | 07245467 A * | 9/1995 |
| JP | 7-263841 A | 10/1995 |
| JP | 9-214140 A | 8/1997 |
| JP | 9-255756 A | 9/1997 |
| JP | 11-4069 A | 1/1999 |
| JP | 11-23649 A | 1/1999 |
| JP | 2877110 B2 | 1/1999 |
| JP | 11-286562 A | 10/1999 |
| JP | 11-350149 A | 12/1999 |
| JP | 2000-147762 A | 5/2000 |
| JP | 2001-123137 A | 5/2001 |
| JP | 2001-144436 A | 5/2001 |
| JP | 2001-160689 A | 6/2001 |
| JP | 2001-192844 A | 7/2001 |
| JP | 2001-217554 A | 8/2001 |
| JP | 2001-345554 A | 12/2001 |
| JP | 2002-26014 A | 1/2002 |
| KR | 0102319 | 3/1988 |

* cited by examiner

METHOD FOR MANUFACTURING MULTILAYER CIRCUIT BOARD AND RESIN BASE MATERIAL

TECHNICAL FIELD

The present invention relates to a method for manufacturing multilayer circuit boards, and more particularly to a method for manufacturing multilayer circuit boards excellent in adhesion of conductor patterns (circuits) to electrical insulating layers. The present invention further relates to a method for manufacturing resin base materials on which metallic patterns or metallic thin films are formed, suitable for manufacturing multilayer circuit boards and the like.

BACKGROUND ART

As electronic equipment becomes further miniaturized and multifunctional, higher density has been requested also for the circuit boards used in the electronic equipment. For making the density of the circuit boards higher, the circuit boards are generally multilayered. The multilayer circuit board is typically obtained by laminating an electrical insulating layer on the surface of an inner layer board on which conductor circuits (conductor patterns) are formed on the outermost surface thereof and forming a conductor circuit on the electrical insulating layer, and it is also possible to further laminate a number of electrical insulating layers and conductor circuits as necessary. Multilayer circuit boards such as multilayer printed wiring boards typically have three or more "conductor patterns/electrical insulating layers", and there are known those with more than 70 layers among them.

In the multilayer circuit boards, adhesion between the electrical insulating layers and the conductor patterns (circuits) formed thereon (hereinafter abbreviated as "pattern adhesion") has become important in order to enhance durability and ensure long life. Generally, the electrical insulation layers to make multilayers are formed using electrical insulating resins.

As the method for enhancing the pattern adhesion, a method in which the surface of the electrical insulating layer is roughened and then conductor patterns are formed thereon is widely adopted, as disclosed in Japanese Patent Laid-Open No. 11-23649, Japanese Patent Laid-Open No. 11-286562, and Japanese Patent No. 2877110. In order to further improve the pattern adhesion, a method for coating adhesives for electroless plating containing polymer components such as rubber or resins on the roughened electrical insulating layers (Japanese Patent Laid-Open No. 2001-192844, Japanese Patent Laid-Open No. 2001-123137, and Japanese Patent Laid-Open No. 11-4069) is proposed.

However, some treatment after forming the electrical insulating layers cannot provide sufficient pattern adhesion for a long period of time when temperature or humidity changes, and causes delamination to shorten the life of the circuit boards.

Japanese Patent Laid-Open No. 2001-160689 proposes a method in which the adhesion between an inner layer board and an electrical insulating layer formed thereon is improved by laminating a thiol compound layer on the inner layer board comprising an electrical insulating layer and a conductor circuit formed thereon so as to cover the conductor circuit, and by forming thereon an electrical insulating layer containing an cycloaliphatic olefin polymer.

According to the method disclosed in Japanese Patent Laid-Open No. 2001-160689, the adhesion between the inner layer board and the electrical insulating layer formed thereon can be improved and the delamination can be suppressed, but the adhesion at the interface between the electrical insulating layer and the conductor circuit formed thereon is insufficient.

Therefore, in multilayer circuit boards, the development of new technology is required for improving the adhesion at the interface between an electrical insulating layer formed on an inner layer board to make multilayers and a conductor circuit formed on the electrical insulating layer.

On the other hand, the members comprised of resin base materials with metallic microlines (metallic patterns or conductor patterns) formed on the surface are used for semiconductor devices, semiconductor device mounting components, various panel displays, IC cards, optical devices and the like.

Typically, these metallic patterns are formed by plating. The methods for forming metallic patterns by plating include (1) a method for forming a metallic pattern by applying electroless plating on the whole surface of a resin base material, forming a resist pattern thereon using a plating resist, growing a metallic layer by electrolytic plating via the resist pattern, and removing an unnecessary electroless plating part by etching (semi-additive process), and (2) a method for plating a desired pattern by electroless plating on a resin base material to form a metallic pattern and growing an electroplated metal thereon as necessary (fully-additive process).

The latter method using a pattern plating process is excellent in productivity, in that metal corrosion by the chemicals used for removing the unnecessary electroless plating part does not occur and a step for removing the electroless plating is not required.

In the pattern plating, metallic patterns can be easily obtained by forming an initiator pattern (also referred to as an electroless plating film) comprised of a plating-inducing substance on the surface of the resin base material and plating on this pattern (e.g., Japanese Patent Laid-Open No. 7-263841). A large number of investigations have been carried out on the plating-inducing substances for the purpose of improving the adhesion to resin base materials and pattern shapes. The plating-inducing substances which are proposed include a conductive material comprised of a mixture of a conductive polymer or a precursor thereof with water or a polar solvent (Japanese Patent Laid-Open No. 2002-26014), a composition consisting of a soluble palladium salt, a water-soluble solvent and water (Japanese Patent Laid-Open No. 7-131135 and Japanese Patent Laid-Open No. 7-245467), and a material containing a photosensitive palladium polymer chelate compound (Japanese Patent Laid-Open No. 2000-147762).

Further, Japanese Patent Laid-Open No. 11-350149 includes resin compositions such as (1) a low molecular weight compound having an N—H bond, an adhesive polymer having a C=C double bond, and a polybasic acid having a C=C double bond, (2) an adhesive polymer having a high N—H bond density, and a low molecular weight polybasic acid or a monobasic acid having a C=C double bond compatible therewith, (3) a resin component forming an N—H bond in a curing reaction and a polybasic acid having a C=C double bond, and (4) a resin component forming an N—H bond in a curing reaction and an adhesive polymer having a C=C double bond on a main chain and a polybasic acid having a C=C double bond.

These plating-inducing substances can ensure easy formation of metallic patterns on resin base materials. However, in the actual use of the resin base materials, the improvement of the adhesion between metallic patterns and resin base materials has been important problems.

In order to improve the adhesion, the surface of the resin base materials is generally roughened by a physical or chemical method so as to obtain a surface roughness Ra of several μm. However, roughness of the surface by roughening reduces the accuracy of metallic patterns, and may cause noise in electrical signals in the case of circuit boards.

Therefore, there is desired the development of a method for obtaining high adhesion between resin base materials and metallic patterns without roughening the surface of the resin base materials.

DISCLOSURE OF THE INVENTION

An object of the present invention is to provide a method for manufacturing multilayer circuit boards excellent in adhesion of conductor circuits to electrical insulating layers.

Another object of the present invention is to provide a method for manufacturing resin base materials on which metallic patterns or metal thin films are formed, suitable for manufacturing multilayer circuit boards.

The inventors have diligently studied to achieve the objects described above and have hit upon a method for forming a curable resin composition layer containing an insulating resin and a curing agent on the surface of an inner layer board with a conductor circuit formed on the surface, so as to cover the conductor circuit, and then bringing the surface of the curable resin composition layer into contact with a compound having a structure capable of coordinating to metal atoms or metal ions.

When the curable resin composition layer is cured to form an electrical insulating layer and a metallic thin film layer is formed on the surface thereof by electroless plating or sputtering, the adhesion between the electrical insulating layer and the metallic thin film layer is remarkably improved. Therefore, when a conductive circuit is formed on the surface of the electric insulating layer according to a conventional process such as a semi-additive process utilizing the metallic thin film layer, it is possible to obtain a multilayer circuit board having excellent adhesion between an electrical insulating layer and a conductor circuit formed thereon. The same method as the above can be applied to a method of forming a metallic thin film on a resin base material.

Further, when the surface of a resin base material formed from a curable resin composition containing an insulating resin and a curing agent is brought into contact with a compound having a structure capable of coordinating to metal atoms or metal ions in a pattern form and the resin base material is then cured and further subjected to electroless plating, it is possible to deposit metal on the pattern of the compound having a structure capable of coordination on the surface of the resin base material. Thus obtained resin base material on which a metallic pattern is formed has excellent adhesion at the interface between the resin base material and the metallic pattern.

The present invention has been completed based on these findings.

Thus, the present invention provides a method for manufacturing a multilayer circuit board comprising:
1) step 1 of forming a curable resin composition layer containing an insulating resin and a curing agent on the surface of an inner layer board having an electrical insulating layer (a) with a conductor circuit (A) formed on the surface thereof, so as to cover said conductor circuit (A);
2) step 2 of bringing a compound having a structure capable of coordinating to metal atoms or metal ions into contact with the surface of said curable resin composition layer;
3) step 3 of forming an electrical insulating layer (b) by curing said curable resin composition layer;
4) step 4 of forming a metallic thin film layer on the surface of said electrical insulating layer (b); and
5) step 5 of forming a conductor circuit (B) on the surface of said electrical insulating layer (b) utilizing said metallic thin film layer.

In addition, the present invention provides a method for manufacturing a resin base material on which a metallic pattern is formed comprising:
I) step (I) of bringing a compound having a structure capable of coordinating to metal atoms or metal ions into contact in a pattern form with the surface of a resin base material formed from a curable resin composition containing an insulating resin and a curing agent;
II) step (II) of curing said resin base material; and
III) step (III) of performing electroless plating to deposit metal on the pattern of a compound having a structure capable of coordination on the surface of said resin base material.

Furthermore, the present invention provides a method for manufacturing a resin base material on which a metallic thin film is formed comprising:
i) step (i) of bringing a compound having a structure capable of coordinating to metal atoms or metal ions into contact with the surface of a resin base material formed from a curable resin composition containing an insulating resin and a curing agent;
ii) step (ii) of curing said resin base material; and
iii) step (iii) of performing electroless plating or sputtering to form a metallic thin film on the surface of said resin base material.

BEST MODE FOR CARRYING OUT THE INVENTION

Figure 1:
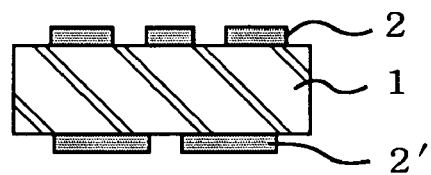
FIG. 1 is a sectional view of an example of an inner layer board for use in the present invention.

1. A General Outline of a Method for Manufacturing a Multilayer Circuit Board

The method for manufacturing the multilayer circuit board of the present invention has the following five steps.

<Step 1>

On the surface of an inner layer board having an electrical insulating layer (a) with a conductor circuit (A) formed on the surface thereof (outer most layer), a curable resin composition layer containing an insulating resin and a curing agent is formed so as to cover the conductor circuit (A).

In the curable resin composition layer, the curable resin composition is present in an uncured or a semi-cured state.

<Step 2>

A compound having a structure capable of coordinating to metal atoms or metal ions is brought into contact with the surface of the curable resin composition layer. The methods for bringing the compound into contact with the surface of the curable resin composition layer include immersion of the curable resin composition layer in a solution of the above described compound, coating of the solution of the above described compound on the curable resin composition layer and the like.

When the compound having a structure capable of coordinating to metal atoms or metal ions is brought into contact with the surface of the curable resin composition layer, the compound is adsorbed on the surface of the curable resin composition layer and penetrated into the resin composition layer, and at least part of the compound is present penetrating around the surface of the resin composition layer.

<Step 3>

The curable resin composition layer is cured to form the electrical insulating layer (b). The curing can generally be performed by heating. The compound having a structure capable of coordinating to metal atoms or metal ions penetrates around the surface of the electrical insulating layer (b) and is firmly held.

Before or after the curing, via holes can be formed for the continuity between an inner layer conductor circuit and an outer layer conductor circuit.

<Step 4>

A metallic thin film layer is formed on the surface of the electrical insulating layer (b). The electrical insulating layer (b) includes the compound having a structure capable of coordinating to metal atoms or metal ions adsorbed or penetrated around the surface, so that it is excellent in the adhesion with the metallic thin film layer without roughening the surface.

In addition, as the surface layer is not formed such that the compound having a structure capable of coordinating to metal atoms or metal ions is separated from the surface, the metallic thin film layer is formed directly on surface of the electrical insulating layer (b), and its adhesion at the interface is remarkably enhanced by the action of the compound.

The metallic thin film layer can be formed by electroless plating, sputtering or the like. After the step 4, a step of heat-treating the metallic thin film layer is preferably added for enhancing the adhesion. The heat treatment of the metallic thin film layer may be carried out under pressure.

<Step 5>

A conductor circuit (B) is formed on the surface of the electrical insulating layer (b) utilizing the metallic thin film layer. The method for forming thick conductor patterns (circuits) by electrolytic plating utilizing the metallic thin film layer formed by electroless plating or sputtering as a seed layer is well known in the art.

Each of the above described steps will now be described in detail below. Incidentally, FIGS. 1 through 6 show steps 1 through 5 which are carried out on both sides using an inner layer board having conductor circuits on both sides, but these steps may only be on one side. Moreover, multilayers of two or more may be made on one or both sides of the inner layer board. Therefore, the following description should be construed as showing representative embodiments of the present invention.

2. Step 1

An inner layer board for use in step 1 of the present invention is the inner layer board with a conductor circuit formed on the surface. An inner layer board has a conductor circuit (A) formed on the surface of an electrical insulating layer (a). Typically, it has a structure in which conductor circuits (A, A') are formed on both sides of an electrical insulating layer (a) and is regarded as a core of a multilayer circuit board.

Specific examples of the inner layer board include a printed wiring board and a silicon wafer substrate. The inner layer board may have various structures such as through holes other than conductor circuits. The electrical insulating layer (a) may be a single layer or a laminate prepared by laminating glass cloths (prepregs) impregnated with resins. The inner layer board may be partially laminated.

The inner layer board has a thickness of preferably from 50 μm to 2 mm, more preferably from 60 μm to 1.6 mm, and most preferably from 100 μm to 1 mm.

The inner layer board preferably has the conductor circuits (A, A') 2 and 2' formed on both sides of the electrical insulating layer (a), as shown in FIG. 1. The finished multilayer circuit board that has been made as vertically symmetrical as possible can minimize the warpage of the board and can reduce the influence of the warpage in the soldering work.

The electrical insulating layer (a) composing the inner layer board is preferably formed using a resin composition composed mainly of insulating resins having electrical insulating properties. The insulating resins may include, for example, but not limited to, cycloaliphaticolefin polymers, epoxy resins, maleimide resins, (meth) acrylic resins, diallyl phthalate resins, triazine resins, aromatic polyether polymers, cyanate ester polymers, and polyimide resins. Conventionally, a curable resin composition containing any of these insulating resins and a curing agent is used to form a resin base material, which is cured to prepare the electrical insulating layer (a). The inner layer board may contain glass fibers or resin fibers for improving strength. The material of the conductor circuit layer (A) for composing the inner layer board is typically a conductive metal.

Figure 2:
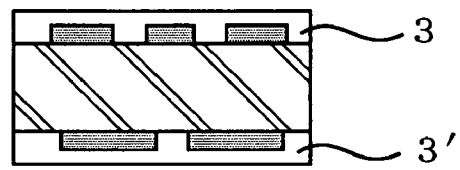
FIG. 2 is a sectional view showing an example of a step of forming a curable resin composition layer on the surface of an inner layer board so as to cover a conductor circuit.

On the surface of the inner layer board, a curing resin composition layer containing an insulating resin and a curing agent is formed so as to cover the conductor circuit (A). When the curable resin composition layers are formed on both sides of the inner layer board, curable resin composition layers 3 and 3' are formed on both sides of the electrical insulating layer (a) 1 of the inner layer board so as to cover conductor circuits (A, A') 2 and 2', as shown in FIG. 2.

The curable resin composition is present in an uncured or a semi-cured state in the curable resin composition layer. The curable resin composition layer that is uncured means that substantially whole of the resin composition layer can be dissolved in a solvent in which the insulating resin composing the resin composition layer is soluble.

The curable resin composition layer is sometimes partially cured by various thermal histories to which the layer is exposed when it is formed, and is brought into a semi-cured state. The curable resin composition layer that is semi-cured means the layer that is partially cured to the extent further curable by heating. Preferably, the curable resin composition layer that is semi-cured is in a state that it can be partially dissolved in a solvent in which the insulating resin composing the resin composition layer is soluble, or has a swelling ratio of 200% or more relative to the volume before immersion, when the resin composition layer is immersed in the solvent for 24 hours.

Methods of forming a thermoset resin composition layer on the surface of an inner layer board preferably include, but not limited to, a method of forming the resin composition layer by bonding together films (including sheets) of a curable resin composition containing an insulating polymer and a curing agent so as to be in contact with the conductor circuit on the inner layer board (method 1), or a method of forming an uncured or a semi-cured resin composition layer by coating a solution of a curable resin composition containing an insulating polymer and a curing agent on the surface of the inner layer board and drying it (method 2).

Forming the resin composition layer by method 1 is more preferable, in that the in-plane uniformity of the adhesion with the metallic thin film layer formed on the electrical insulating layer obtained by curing a curable resin composition layer is high.

When the resin composition layer is formed by the method 1, the surface of an inner layer board on which a conductive circuit is formed is preferably pre-treated before the films of a curable resin composition are bonded together in order to improve the adhesive strength between the inner layer board on which a conductive circuit is formed and an electrical insulating layer. The pre-treatment methods include (1) a method of bringing an alkaline aqueous solution of sodium chlorite, permanganic acid or the like into contact with the surface of the inner layer board to roughen the surface, (2) a method of oxidizing the surface by an alkaline aqueous solution of potassium persulfate, an aqueous solution of potassium sulfide-ammonium chloride or the like and then reducing it, (3) a method of depositing the plating on the part of the conductor circuit on the inner layer board to roughen it, (4) a method of forming a primer layer on the surface of the inner layer board by a thiol compound, a silane compound or the like.

Among these treatment methods, a method of forming a primer layer using thiol compounds such as 2-di-n-butylamino-4,6-dimercapto-s-triazine is suitable in that when the conductor circuit is formed of copper, corrosion of the copper is prevented and high adhesion is obtained.

(1) Insulating Resins:

The insulating resins for composing the curable resin composition are not limited as long as they have electrical insulating properties, and include, as specific examples thereof, epoxy resins, maleimide resins, (meth) acrylic resins, diallyl phthalate resins, triazine resins, cycloaliphatic olefin polymers, aromatic polyether polymers, benzocyclobutene polymers, cyanate ester polymers, and polyimide resins.

Among these insulating resins, cycloaliphatic olefin polymers, aromatic polyether polymers, benzocyclobutene polymers, cyanate ester polymers, and polyimide resins are preferred; cycloaliphatic olefin polymers and aromatic polyether polymers are more preferred; and cycloaliphatic olefin polymers are most preferred.

Liquid crystal polymers can also be used as the insulating resins. Examples of the liquid crystal polymers may include polymers of aromatic or aliphatic dihydroxy compounds, polymers of aromatic or aliphatic dicarboxylic acids, polymers of aromatic hydroxycarboxylic acids and polymers of aromatic diamines, aromatic hydroxyamines or aromatic aminocarboxylic acids.

Although there is no particular limit in the weight average molecular weight (Mw) of the insulating resins, it ranges preferably from 10,000 to 1,000,000, more preferably from 50,000 to 500,000, when the insulating resin is an insulating polymer such as a cycloaliphatic olefin polymer. The insulating polymer having a weight average molecular weight of 10,000 to 1,000,000 is desirably present in a ratio of preferably 20% or more by weight, more preferably from 30 to 100% by weight relative to 100% by weight of the insulating resin component contained in a curable resin composition, in that when electroless plating is performed to form a metallic thin film layer in later step 4, the roughening of the electrical insulating layer (b) by the pre-treatment is suppressed.

As the insulating resins other than the polymer having a weight average molecular weight within the range of 10,000 to 1,000,000, the insulating resin having a weight average molecular weight of less than the lower limit of the range, or the insulating polymer having a weight average molecular weight of more than the upper limit of the range can be used in combination with the above described insulating resin.

In the present invention, the weight average molecular weight is the weight average molecular weight in terms of polystyrene or polyisoprene determined by gel permeation chromatography (GPC).

Cycloaliphatic olefin polymers refer to unsaturated hydrocarbon polymers having a cycloaliphatic structure. The cycloaliphatic structure, which includes a cycloalkane structure and a cycloalkene structure, is preferably a cycloalkane structure in terms of mechanical strengths, heat resistance and the like. The cycloaliphatic structure may be either monocyclic or polycyclic (such as fused polycyclic, bridged ring, or a combination thereof). The number of carbon atoms composing the cycloaliphatic structure is, but not limited to, in the range generally from 4 to 30, preferably from 5 to 20 and more preferably from 5 to 15. This highly balances various properties such as mechanical strengths, heat resistance and moldability. The cycloaliphatic olefin polymers for use in the present invention preferably exhibit thermo setting property in combination with curing agents.

Cycloaliphatic olefin polymers preferably have polar groups. The polar groups may include a hydroxyl group, a carboxyl group, an alkoxy group, an epoxy group, a glycidyl group, an oxycarbonyl group, a carbonyl group, an amino group, an ester group, and a carboxylic anhydride group. A carboxyl group and a carboxylic anhydride group are preferred among them.

Cycloaliphatic olefin polymers may be obtained, typically, by (1) a method for subjecting cycloaliphatic olefins to addition polymerization or ring-opening polymerization and hydrolyzing the unsaturated bond portions of the resultant polymers as necessary, or by (2) a method for subjecting aromatic olefins to addition polymerization and hydrolyzing the aromatic ring portions of the resultant polymers.

The cycloaliphatic olefin polymers having polar groups may be obtained by, for example, (1) a method for introducing polar groups into cycloaliphatic olefin polymers by modification reaction, (2) a method for copolymerizing monomers including polar groups as copolymerization components, or (3) a method for copolymerizing monomers including polar groups such as an ester group as copolymerization components and then hydrolyzing the ester group or the like.

Examples of cycloaliphatic olefins that are used for obtaining cycloaliphatic olefin polymers include: norbornene monomers such as bicyclo[2.2.1]-hept-2-ene (trivial name "norbornene"), 5-methyl-bicyclo[2.2.1]-hept-2-ene, 5,5-dimethyl-bicyclo[2.2.1]-hept-2-ene, 5-ethyl-bicyclo[2.2.1]-hept-2-ene, 5-butyl-bicyclo[2.2.1]-hept-2-ene, 5-hexyl-bicyclo[2.2.1]-hept-2-ene, 5-octyl-bicyclo[2.2.1]-hept-2-ene, 5-octadecyl-bicyclo[2.2.1]-hept-2-ene, 5-ethylidene-bicyclo[2.2.1]-hept-2-ene, 5-methylidene-bicyclo[2.2.1]-hept-2-ene, 5-vinyl-bicyclo[2.2.1]-hept-2-ene, 5-propenyl-bicyclo[2.2.1]-hept-2-ene, 5-methoxy-carbonyl-bicyclo[2.2.1]-hept-2-ene, 5-cyano-bicyclo[2.2.1]-hept-2-ene, 5-methyl-5-methoxycarbonyl-bicyclo[2.2.1]-hept-2-ene, 5-ethoxycarbonyl-bicyclo[2.2.1]-hept-2-ene, bicyclo[2.2.1]-hept-5-enyl-2-methyl propionate, bicyclo[2.2.1]-hept-5-enyl-2-methyl octanate, bicyclo[2.2.1]-hept-2-ene-5,6-dicarboxylic anhydride, 5-hydroxymethylbicyclo[2.2.1]-hept-2- ene, 5,6-di(hydroxymethyl)-bicyclo[2.2.1]-hept-2-ene, 5-hydroxy-i-propylbicyclo[2.2.1]-hept-2-ene, 5,6-dicarboxy-bicyclo[2.2.1]-hept-2-ene, bicyclo[2.2.1]-hept-2-ene-5,6-dicarboxylic imide, 5-cyclopentyl-bicyclo[2.2.1]-hept-2-ene, 5-cyclohexyl-bicyclo[2.2.1]-hept-2-ene, 5-cyclohexenyl-bicyclo[2.2.1]-hept-2-ene, 5-phenyl-bicyclo[2.2.1]-hept-2-ene, tricyclo[4.3.0.1$^{2,5}$]deca-3,7-diene (trivial name "dicyclopentadiene"), tricyclo[4.3.0.1$^{2,5}$]deca-3-ene, tricyclo[4.4.0.1$^{2,5}$]undeca-3,7-diene, tricyclo[4.4.0.1$^{2,5}$]undeca-3,8-diene, tricyclo[4.4.0.1$^{2,5}$]undeca-3-ene, tetracyclo[7.4.0.1$^{10,13}$.0$^{2,7}$]-trideca-2,4,6-11-tetraene (alias name "1,4-methano-1,4,4a,9a-tetrahydrofluorene"), tetracyclo[8.4.0.1$^{11,14}$.0$^{3,8}$]-tetradeca-3,5,7,12,11-tetraen e (alias name "1,4-methano-1,4,4a,5,10,10a-hexahydroanthracene"), tetracyclo[4.4.0.1$^{2,5}$.1$^{7,10}$]-dodeca-3-ene (trivial name "tetracyclododecene"), 8-methyl-tetracyclo[4.4.0.1$^{2,5}$.1$^{7,10}$]-dodeca-3-ene, 8-ethyl-tetracyclo[4.4.0.1$^{2,5}$.1$^{7,10}$]-dodeca-3-ene, 8-methylidene-tetracyclo[4.4.0.1$^{2,5}$.1$^{7,10}$]-dodeca-3-ene, 8-ethylidene-tetracyclo[4.4.0.1$^{2,5}$.1$^{7,10}$]-dodeca-3-ene, 8-vinyl-tetracyclo[4.4.0.1$^{2,5}$.1$^{7,10}$]-dodeca-3-ene, 8-propenyl-tetracyclo[4.4.0.1$^{2,5}$.1$^{7,10}$]-dodeca-3-ene, 8-methoxycarbonyl-tetracyclo[4.4.0.1$^{2,5}$.1$^{7,10}$]-dodeca-3-ene, 8-methyl-8-methoxycarbonyl-tetracyclo[4.4.0.1$^{2,5}$.1$^{2,5}$.1$^{7,10}$]-dodeca-3-ene, 8-hydroxymethyl-tetracyclo[4.4.0.1$^{2,5}$.1$^{2,5}$.1$^{7,10}$]-dodeca-3-ene, 8-carboxy-tetracyclo[4.4.0.1$^{2,5}$.1$^{7,10}$]-dodeca-3-ene, 8-cyclopentyl-tetracyclo[4.4.0.1$^{2,5}$.1$^{7,10}$]-dodeca-3-ene, 8-cyclohexyl-tetracyclo[4.4.0.1$^{2,5}$.1$^{7,10}$]-dodeca-3-ene, 8-cyclohexenyl-tetracyclo[4.4.0.1$^{2,5}$.1$^{7,10}$]-dodeca-3-ene, 8-phenyl-tetracyclo[4.4.0.1$^{2,5}$1$^{7,10}$]-dodeca-3-ene, and pentacyclo[6.5.1.1$^{3,6}$.0$^{2,7}$.0$^{9,13}$]pentadeca-3,10-diene, pentacyclo[7.4.0.1$^{3,6}$.1$^{10,13}$.0$^{2,7}$]-pentadeca-4,11-diene; monocyclic cycloalkenes such as cyclobutene, cyclopentene, cyclohexene, 3,4-dimethylcyclopentene, 3-methylcyclohexene, 2-(2-methylbutyl)-1-cyclohexene, cyclooctene, 3a,5,6,7a-tetrahydro-4,7-methano-1H-indene, and cycloheptene; vinyl alicyclic hydrocarbon monomers such as vinylcyclohexene and vinylcyclohexane; and alicyclic conjugated diene monomers such as cyclopentadiene and cyclohexadiene.

Examples of aromatic olefins include styrene, α-methylstyrene, and divinylbenzene.

Cycloaliphatic olefins and/or aromatic olefins may be used singly or in combination.

Cycloaliphatic olefin polymers may include those obtained by copolymerizing cycloaliphatic olefins and/or aromatic olefins with monomers copolymerizable therewith.

Examples of monomers that are copolymerizable with a cycloaliphatic olefin or an aromatic olefin include: ethylene; α-olefins having 3 to 20 carbon atoms such as propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, and 1-eicosene; unconjugated dienes such as 1,4-hexadiene, 4-methyl-1,4-hexadiene, 5-methyl-1,4-hexadiene, and 1,7-octadiene. These monomers may be used singly or in combination.

A method for polymerizing cycloaliphatic olefins and aromatic olefins and a method of hydrogenation performed as necessary are not particularly limited, but may be performed in accordance with well-known methods.

Examples of the cycloaliphatic olefin polymers include (1) ring-opening polymers of norbornene monomers and their hydrogenated derivatives, (2) addition polymers of norbornene monomers, (3) addition polymers of norbornene monomers to vinyl compounds, (4) monocyclic cycloalkene polymers, (5) cycloaliphatic conjugated diene polymers, (6) vinyl cycloaliphatic hydrocarbon polymers and their hydrogenated derivatives, and (7) aromatic ring hydrogenated derivatives of aromatic olefin polymers. Among them, ring-opening polymers of norbornene monomers and their hydrogenated derivatives, addition polymers of norbornene monomers, addition polymers of norbornene monomers to vinyl compounds, and aromatic ring hydrogenated derivatives of aromatic olefin polymers are preferred, and hydrogenated derivatives of ring-opening polymers of norbornene monomers are most preferred.

The cycloaliphatic olefin polymers may be used singly or in combination.

Among the cycloaliphatic olefin polymers, most preferred ring-opening polymers of norbornene monomers and their hydrogenated derivatives are classified as the different polymers from the polyolefin resins obtained by copolymerizing olefins represented by $C_nH_{2n}$ due to the difference of their structures.

The methods for adjusting the weight average molecular weight of the cycloaliphatic olefin polymers may be performed according to conventional methods, and include, for example, a method in which when undergoing the ring-opening polymerization of cycloaliphatic olefins using a titanium-based or tungsten-based catalyst, a molecular weight modifier such as vinyl compounds or diene compounds is added in an amount approximately from 0.1 to 10 mol % relative to the total amount of the monomers. At this time, the use of smaller amount of the molecular weight modifier will provide polymers having relatively high weight average molecular weight, and larger amount will provide polymers having relatively low weight average molecular weight.

Examples of vinyl compounds that are used as a molecular weight modifier include: α-olefin compounds such as 1-butene, 1-pentene, 1-hexene, and 1-octene; styrene compounds such as styrene and vinyl toluene; ether compounds such as ethyl vinyl ether, isobutyl vinyl ether, and allyl glycidyl ether; halogen containing vinyl compounds such as allyl chloride; oxygen containing vinyl compounds such as allyl acetate, allyl alcohol, and glycidyl methacrylate; nitrogen containing vinyl compounds such as acrylamide.

Examples of diene compounds that are used as a molecular weight modifier include: unconjugated diene compounds such as 1,4-pentadiene, 1,5-hexadiene, 1,6-heptadiene, 2-methyl-1,4-pentadiene, and 2,5-dimethyl-1,5-hexadiene; and conjugated diene compounds such as 1,3-butadiene, 2-methyl-1,3-butadiene, 2,3-dimethyl-1,3-butadiene, 1,3-pentadiene, and 1,3-hexadiene.

The glass transition temperature of the cycloaliphatic olefin polymers may be appropriately selected depending on intended use, and is generally 50° C. or higher, preferably 70° C. or higher, more preferably 100° C. or higher, most preferably 125° C. or higher.

(2) Curing Agent

Curing agents for use in the present invention include, but not limited to, for example, ionic curing agents, radical curing agents, and curing agents having both ionic and radical properties. Examples of curing agents include: nitrogen curing agents such as isocyanurate curing agents that contain an allyl group and an epoxy group and do not contain a halogen such as 1-allyl-3,5-diglycidylisocyanurate and 1,3-diallyl-5-glycidylisocyanurate; polyhydric epoxy compounds such as glycidylether expoxy compounds such as bisphenol A bis(ethyleneglycolglycidylether)ether, bisphenol A bis (diethyleneglycolglycidylether)ether, bisphenol A bis (triethyleneglycolglycidylether)ether, and bisphenol A bis (propyleneglycolglycidylether)ether, cycloaliphatic epoxy compounds, and glycidyl ester epoxy compounds; dicarboxylic acid derivatives such as acid anhydrides and dicarboxylic acid compounds; and polyol compounds such as diol compounds, triol compounds, and polyhydric phenol compounds.

Among these curing agents, polyhydric epoxy compounds are preferred, and glycidyl ether epoxy compounds are particularly preferred in terms of enhancing crack resistance.

(3) Curing Accelerators and Curing Aids

To promote curing reaction between cycloaliphatic olefin polymers and curing agents, curing accelerators and curing aids may be used. When for example polyhydric epoxy compounds are used as curing agents, tertiary amine compounds and trifluorinated boron complex compounds are suitable as curing accelerators. Among them, use of tertiary amine compounds improves lamination properties, insulating resistance, heat resistance and chemical resistance to microscopic wiring (microscopic conductor pattern).

Examples of tertiary amine compounds include acyclic tertiary amine compounds such as benzyldimethylamine, triethanolamine, triethylamine, tributylamine, tribenzylamine, dimethylformamide; compounds such as pyrazoles, pyridines, pyrazines, pirimidines, indazoles, quinolines, isoquinolines, imidazoles, triazoles and the like. Among them, imidazoles are preferred, and substituted imidazoles having substituted groups are most preferred.

Specific examples of substituted imidazole compounds include: alkyl-substituted imidazole compounds such as 2-ethylimidazole, 2-ethyl-4-methylimidazole, bis-2-ethyl-4-methylimidazole, 1-methyl-2-ethylimidazole, 2-isopropylimidazole, 2,4-dimethylimidazole, and 2-heptadecylimidazole; imidazole compounds substituted by a hydrocarbon group containing a cyclic structure such as an aryl group or aralkyl group such as 2-phenylimidazole, 2-phenyl-4-methylimidazole, 1-benzyl-2-methylimidazole, 1-benzyl-2-ethylimidazole, 1-benzyl-2-phenylimidazole, benzimidazole, 2-ethyl-4-methyl-1-(2'-cyanoethyl)imidazole, and 2-ethyl-4-methyl-1-[2'-(3",5"-diaminotriazinyl)ethyl]imid azole. Among them, imidazoles having substituted groups including a ring structure are preferred in terms of compatibility with cycloaliphatic olefin polymers, and 1-benzyl-2-phenylimidazole is most preferred.

Curing accelerators are used singly or in combination. The loading of the curing accelerators is appropriately selected depending on intended use, and generally from 0.001 to 30 parts by weight, preferably from 0.01 to 10 parts by weight, more preferably from 0.03 to 5 parts by weight, relative to 100 parts by weight of insulating polymers.

Examples of curing aids include oxime-nitroso curing aids such as quinone dioxime, benzoquinone dioxime, and p-nitrosophenol; maleimide curing aids such as N,N-m-phenylene bismaleimide; allyl curing aids such as diallyl phthalate, triallyl cyanurate, and triallyl isocyanurate; methacrylate curing aids such as ethylene glycol dimethacrylate and trimethylol propane trimethacrylate; vinyl curing aids such as vinyl toluene, ethyl vinyl benzene, and divinyl benzene; and tertiary amine compounds such as 1-benzyl-2-phenylimidazole. In addition to these compounds, peroxides acting as curing aids for curing agents having an allyl group can be used.

(4) Other Components

The curable resin composition according to the present invention may formulate other components as necessary. For example, it is possible to formulate compounds having absorption in the wavelength region of laser beams used for forming holes such as via holes or through holes. For example, silica is used when using carbon dioxide gas laser, and ultraviolet absorbers are used when using ultraviolet laser (for example, UV-YAG laser or the like). Use of compounds having absorption in the wavelength region of laser beams facilitates the formation of holes by lasers and reduces the occurrence of a smear.

Specific examples of ultraviolet absorbers include salicylic acid compounds such as phenyl salicylate, p-tert-butylphenyl salicylate, p-octylphenyl salicylate; benzophenone compounds such as 2,4-dihydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,2'-dihydroxy-4,4'-dimethoxybenzophenone, 2-hydroxy-4-methoxy-5-sulfobenzophenone, bis(2-hydroxy-4-methoxybenzoylphenyl)methane; benzotriazole compounds such as 2-(2'-hydroxy-5'-methylphenyl)benzotriazole, 2-(2'-hydroxy-5'-tert-butylphenyl)benzotriazole, 2-(2'-hydroxy-3',5'-di-tert-butylphenyl)-5-chlorobenzotri azole, 2-(2'-hydroxy-3',5'-di-tert-amylphenyl)benzotriazole, 2-[2'-hydroxy-3'-(3",4",5",6"-tetrahydrophthalimidomethyl)-5'-methylphenyl] benzotriazole, 2,2-methylenebis[4-(1,1,3,3-tetramethylbutyl)-6-(2H-benzo triazol-2-yl)phenol], 2-[2-hydroxy-3,5-bis(α,α-dimethylbenzyl)phenyl]benzotria zole; benzoate compounds such as 2,4-di-tert-butylphenyl-3',5'-di-tert-butyl-4'-hydroxyben zoate; cyanoacrylate compounds such as 2-ethylhexyl-2-cyano-3,3'-diphenylacrylate, ethyl-2-cyano-3,3'-diphenylacrylate; hindered amine compounds such as bis(2,2,6,6-tetramethylpiperidinyl4)sebacate; organic metal compounds such as nickel bis(octylphenyl) sulfide, [2,2'-thiobis(4-tert-octylphenolate)]-n-butylamine nickel; and inorganic compounds such as zinc oxide, tin oxide, titanium oxide, calcium carbonate, silica, and clay. Among them, benzotriazole compounds are preferable in terms of being excellent in compatibility with ring structure-containing polymers and stability during thermal curing.

The ultraviolet absorbers are formulated in an amount of generally from 0.1 to 30 parts by weight, preferably from 1 to 10 parts by weight, relative to 100 parts by weight of insulating polymers.

Additional components that may be used include flame retardants, flexible polymers, heat stabilizers, weathering stabilizers, antioxidants, leveling agents, antistatic agents, slip agents, antiblocking agents, antifog agents, lubricant, dye, pigment, natural oil, synthetic oil, wax, emulsion and fillers. The loadings may be appropriately selected within the range where objects of the present invention are not impaired.

(5) Films of Curable Resin Compositions

The films (including sheets) of curable resin compositions used for forming a curable resin composition layer are typically formed from curable resin compositions by a solution casting process or a melt casting process. When the films are formed by the solution casting process, a solution of insulating resins and curing agents in organic solvents (varnish) is coated on supports and then the organic solvents are removed by drying.

The supports for use in the solution casting process include resin films (carrier films) and metal foil. Thermoplastic resin films are generally used as the resin films, and specifically include polyethylene terephthalate films, polypropylene films, polyethylene films, polycarbonate films, polyethylene naphthalate films, polyallylate films and nylon films. Among these resin films, polyethylene terephthalate films and polyethylene naphthalate films are preferred in terms of heat resistance, chemical resistance and peeling properties after lamination.

The metal foil for the supports includes, for example, copper foil, aluminum foil, nickel foil, chromium foil, gold foil and silver foil. Copper foil, particularly electrolytic copper foil or rolled copper foil, is preferred in terms of good electrical conductance and low cost. The thickness of the supports is, but not particularly limited to, generally from 1 to 150 μm, preferably from 2 to 100 μm, more preferably from 3 to 50 μm, in terms of workability or the like.

The method for obtaining the varnish is not particularly limited, and it can be obtained, for example, by mixing each component composing the curable resin composition with an organic solvent. The method for mixing each component may be in accordance with conventional methods, and may include, for example, methods using agitation with a stirrer and a magnetic stirrer, a high speed homogenizer, a dispersion, a planetary stirring machine, a double spindle stirrer, a ball mill and a triple-roll. The temperature for mixing them is preferably within the temperature where the reaction by the curing agents has no effect on workability, and preferably below the boiling point of the organic solvents to be used at the mixing, in terms of safety.

The organic solvents include, for example, aromatic hydrocarbon organic solvents such as toluene, xylene, ethylbenzene and trimethylbenzene; aliphatic hydrocarbon organic solvents such as n-pentane, n-hexane and n-heptane; cycloaliphatic hydrocarbon organic solvents such as cyclopentane and cyclohexane; halogenated hydrocarbon organic solvents such as chlorobenzene, dichlorobenzene and trichlorobenzene; ketone organic solvents such as methyl ethyl ketone, methyl isobutyl ketone, cyclopentanone and cyclohexanone; and the like. These organic solvents may be used singly or in combination.

Among these organic solvents, those preferred in terms of having good burying properties for microscopic wiring and producing no blisters are mixed organic solvents prepared by mixing non-polar organic solvents such as aromatic hydrocarbon organic solvents and cycloaliphatic hydrocarbon organic solvents with polar organic solvents such as ketone organic solvents. The mixing ratio of non-polar organic solvents and polar organic solvents may be appropriately selected, and ranges generally from 5:95 to 95:5, preferably from 10:90 to 90:10, more preferably from 20:80 to 80:20, by weight ratio.

Usage of organic solvents is appropriately selected depending on objects such as thickness control or improvement of flatness, and it ranges generally from 5 to 70% by weight, preferably from 10 to 65% by weight, more preferably from 20 to 60% by weight, in terms of solid content of the varnish.

Methods for coating include the methods such as dip coating, roll coating, curtain coating, die coating and slit coating. Conditions for removing and drying organic solvents are appropriately selected depending on types of organic solvents. Drying temperature is generally from 20 to 300° C., preferably from 30 to 200° C. Drying time is generally from 30 seconds to 1 hour, preferably from 1 minute to 30 minutes.

The thickness of films is generally from 0.1 to 150 μm, preferably from 0.5 to 100 μm, more preferably from 1 to 80 μm. When the film is desired to be obtained by itself, the film is formed on a support and then peeled from the support.

For bonding the film of the curable resin composition to the surface of the inner layer board in step (1), generally, the film with a support is overlapped such that the film is brought into contact with the conductor circuit and subjected to thermo-compression bonding (lamination) using a pressure machine such as a pressure laminator, a press, a vacuum laminator, a vacuum press, or a roll laminator to combine the both so that substantially no air-gap is present at the interface between the board surface and the film. The thermo-compression bonding is preferably performed under vacuum to improve burying properties to the wiring and to suppress generation of blisters or the like. The temperature during the thermo-compression bonding is generally from 30 to 250° C., preferably from 70 to 200° C.; the strength of the compression bonding is generally from 10 kPa to 20 MPa, preferably from 100 kPa to 10 MPa; and the time of the compression bonding is generally from 30 seconds to 5 hours, preferably from 1 minute to 3 hours. During the thermo-compression bonding, the atmosphere is reduced to generally from 100 kPa to 1 Pa, preferably from 40 kPa to 10 Pa.

The films to be bonded together to the inner layer board may be two or more. For example, the inner layer board having a film laminated thereon may be laminated with a different film, such that it is brought into contact with the film on the inner layer board, for the purpose of improving the flatness of the electrical insulating layer (b) or increasing the thickness of the electrical insulating layer (b). When films are laminated by bonding a plurality of films together to the inner layer board, it is the surface of the film laminated last that is brought into contact with the compound having a structure capable of coordinating to metal atoms or metal ions in the next step 2.

When the resin composition layer is formed by a coating process, the varnish of the curable resin composition may be directly coated on the inner layer board and dried. The procedures and conditions of coating and drying may be the same as the case for forming the film of the curable resin composition.

3. Step 2

In step 2, a compound having a structure capable of coordinating to metal atoms or metal ions is brought into contact with the surface of the curable resin composition layer formed in step 1. When a film of a curable resin composition is bonded together to an inner layer board to form the resin composition layer, wherein the film has a support, the step 2 is carried out after the support is removed.

Examples of compounds having a structure capable of coordinating to metal atoms or metal ions (hereinafter may be referred to "a coordination structure-containing compound") include, but not limited to, compounds having functional groups capable of coordinating to metal atoms or metal ions such as an amino group, a thiol group, a carboxyl group or a cyano group; and compounds having unshared electron pairs such as heterocyclic compounds having coordination capability to metal atoms or metal ions.

Among them, heterocyclic compounds containing nitrogen atoms, oxygen atoms, or sulfur atoms are preferred, and those containing nitrogen atoms are more preferred. These heterocyclic compounds may further comprise functional groups capable of coordinating to metal atoms or metal ions. Heterocyclic compounds further comprising functional groups capable of coordinating to metal atoms or metal ions are preferable in that they provide higher pattern adhesion.

Examples of heterocyclic compounds containing an oxygen atom, sulfur atom, or nitrogen atom include pyrroles, pyrrolines, pyrrolidines, pyrazoles, pyrazolines, pyrazolidines, imidazoles, imidazolines, triazoles, tetrazoles, pyridines, piperidines, pyridazines, pyrimidines, pyrazines, piperazines, triazines, tetrazines, indoles, isoindoles, indazoles, purines, norharmanes, perimidines, quinolines, isoquinolines, cinnolines, quinosalines, quinazolines, naphthylidines, pteridines, carbazoles, acridines, phenazines, phenanthridines, phenanthrolines, furans, dioxolanes, pyrans, dioxanes, benzofurans, isobenzofurans, cormalines, dibenzofurans, flavones, trithianes, thiophenes, benzothiophenes, isobenzothiophenes, dithiins, thianthrenes, thienothiophenes, oxazoles, isoxazoles, oxadiazoles, oxazines, morpholines, thiazoles, isothiazoles, thiadiazoles, thiazines, and phenothiazines.

Among them, the following compounds are preferred in that these compounds react with the components in a curable resin composition, are firmly held in the electrical insulating layer (b) to be formed in the next step, and provide the effect that the metallic thin film layer to be formed thereafter is hardly delaminated.

(1) Imidazoles:

Imidazoles; imidazoles having a thiol group such as 2-mercaptoimidazole, 2-mercaptomethylbenzoimidazole, 2-(2-mercaptoethyl)-benzoimidazole, and 2-mercapto-4-azabenzoimidazole; imidazoledithiocarboxylic acids such as imidazole-4-dithiocarboxylic acid, 2-methylimidazole-4-dithiocarboxylic acid, 2-ethylimidazole-4-dithiocarboxylic acid, 2-isopropylimidazole-4-dithiocarboxylic acid, 2-n-butylimidazole-4-dithiocarboxylic acid, 2-phenylimidazole-4-dithiocarboxylic acid, 4-methylimidazole-5-dithiocarboxylic acid, 2-phenyl-4-methylimidazole-5-dithiocarboxylic acid, 2-ethylimidazole-4-dithiocarboxylic acid, and 2-n-undecylimidazole-4-dithiocarboxylic acid; imidazoles having a carboxyl group such as imidazole-2-carboxylic acid, imidazole-4-carboxylic acid, 2-methylimidazole-4-carboxylic acid, 2-phenylimidazole-4-carboxylic acid, 2-methyl-4-methylimidazole-5-carboxylic acid, 2-(2-carboxyethyl)-benzoimidazole, and imidazole-2-carboxyamide; imidazoles having an amino group such as 1-(2-aminoethyl)-2-methylimidazole, 1-(2-aminoethyl)-2-ethylimidazole, 2-aminoimidazole sulfate, and 2-(2-aminoethyl)-benzoimidazole; imidazoles having a cyano group such as 2-cyanioimidazole, 4-cyanoimidazole, 4-methyl-5-cyanoimidazole, 2-methyl-5-cyanoimidazole, 2-phenyl-5-cyanoimidazole, 4-cyanomethylimidazole, 1-(2-cyanoethyl)-2-ethylimidazole, 1-(2-cyanoethyl)-2-ethyl-4-methylimidazole, 1-(2-cyanoethyl)-2-n-undecylimidazole, and 1-(2-cyanoethyl)-2-phenylimidazole; imidazoles having other groups such as 2-methylimidazole, 2-ethylimidazole, 2-isopropylimidazole, 2-n-propylimidazole, 2-n-butylimidazole, 2-phenylimidazole, 2-n-undecylimidazole, 2-n-heptadecylimidazole, 1,2-dimethylimidazole, 1-methyl-2-ethylimidazole, 1-benzyl-2-methylimidazole, 1-benzyl-2-ethylimidazole, 1-benzyl-2-phenylimidazole, 4-methylimidazole, 2,4-dimethylimidazole, 2-ethyl-4-methylimidazole, 2-n-butyl-4-methylimidazole, 2-phenyl-4-methylimidazole, 1-methylimidazole, 2-n-butyl-4-chloro-5-formylimidazole, 2-formylimidazole, 4-formylimidazole, 2-methyl-4-formylimidazole, 2-n-butyl-4-formylimidazole, 2-phenyl-4-formylimidazole, 4-methyl-5-formylimidazole, 2-ethyl-4-methyl-5-formylimidazole, 2-phenyl-4-methyl-5-formylimidazole, 2-methyl-4,5-diformylimidazole, 2-ethyl-4,5-diformylimidazole, 2-isopropyl-4,5-diformylimidazole, 2-n-propyl-4,5-diformylimidazole, 2-n-butyl-4,5-diformylimidazole, 2-n-undecyl-4,5-diformylimidazole, 2-nitroimidazole, 1-{2-hydroxy-3-(3-trimethoxysilylpropyloxy)}propylimidazole, 4-hydroxy-methylimidazole hydrochloride, 2-hydroxymethylimidazole hydrochloride, 2-methyl-4,5-dihydroxymethylimidazole, 2-ethyl-4,5-dihydroxymethylimidazole, 2-isopropyl-4,5-dihydroxymethylimidazole, 2-n-propyl-4,5-dihydroxymethyl-imidazole, 2-n-butyl-4,5-dihydroxymethylimidazole, 2-phenyl-4,5-dihydroxymethylimidazole, 2-n-undecyl-4,5-dihydroxymethylimidazole, benzoimidazole, benzoimidazole, 2-hydroxymethylbenzoimidazole, 2-chloromethylbenzo-imidazole, 1-{3-(3-trimethoxysilylpropyloxy)}-propylimidazole, 4-thiocarbamoylimidazole, 2-methyl-4-thiocarbamoylimidazole, 4-methyl-5-thiocarbamoylimidazole, 2-ethyl-4-methyl-5-thiocarbamoylimidazole, 2-phenyl-4-thiocarbamoylimidazole, 2-(2'-methylimidazolyl-4')-benzoimidazole, 2-(2'-phenylimidazolyl-4')-benzoimidazole, 4-azabenzoimidazole, 2-hydroxy-4-azabenzoimidazole, and 2-hydroxymethyl-4-azabenzoimidazole; or the like.

(2) Pyrazoles:

Pyrazole; pyrazoles having a carboxyl group such as 4-carboxymethylpyrazole, 5-carboxymethylpyrazole, 1-methyl-4-carboxymethylpyrazole, 1-isopropyl-4-carboxymethylpyrazole, 1-benzyl-4-carboxymethylpyrazole, 1-methyl-5-carboxymethylpyrazole, 1-isopropyl-5-carboxymethylpyrazole, 1-benzyl-5-carboxymethylpyrazole, 1,3-dimethyl-4-carboxymethylpyrazole, 1-isopropyl-3-methyl-4-carboxymethylpyrazole, 1-benzyl-3-methyl-4-carboxymethylpyrazole, 1,3-dimethyl-5-carboxymethylpyrazole, 1-isopropyl-3-methyl-5-carboxymethylpyrazole, 1-benzyl-3-methyl-5-carboxymethylpyrazole, 1,5-dimethyl-4-carboxymethylpyrazole, 1-methyl-4-carboxymethyl-5-hydroxypyrazole, 1-methyl-4-chloro-5-carboxymethylpyrazole, 1-methyl-4,5-dicarboxymethylpyrazole, 1-methyl-4-cyano-5-carboxymethylpyrazole, 1-methyl-4-carboxymethyl-5-chloropyrazole, 1-isopropyl-4-carboxymethyl-5-methylpyrazole, 1-isopropyl-4-carboxymethyl-5-hydroxypyrazole, 1-isopropyl-4-chloro-5-carboxymethylpyrazole, 1-isopropyl-4,5-dicarboxymethylpyrazole, 1-isopropyl-4-dicarboxymethyl-5-chloropyrazole, 1-benzyl-4-carboxymethyl-5-hydroxypyrazole, 1-benzyl-4-carboxymethyl-5-methylpyrazole, 1-benzyl-4-chloro-5-carboxymethylpyrazole, 1-benzyl-4,5-dicarboxymethylpyrazole, 1-benzyl-4-carboxymethyl-5-chloropyrazole, 3-methyl-4-carboxymethyl-5-hydroxypyrazole, 3,5-dimethyl-4-carboxymethylpyrazole, 3-methyl-4-chloro-5-carboxymethylpyrazole, 3-methyl-4,5-dicarboxymethylpyrazole, 3-methyl-4-dicarboxymethyl-5-chloropyrazole, 1,3,5-trimethyl-4-carboxymethylpyrazole, 1-benzyl-3,5-dimethyl-4-carboxymethylpyrazole, 1,3-dimethyl-4-carboxymethyl-5-hydroxypyrazole, 1,3-dimethyl-4-chloro-5-carboxymethylpyrazole, and 1,3-dimethyl-4,5-dicarboxymethylpyrazole; pyrazoles having a cyano group such as 4-cyanopyrazole, 1-methyl-4-cyanopyrazole, 1-isopropyl-4-cyanopyrazole, 1-benzyl-4-cyanopyrazole, 1,3-dimethyl-4-cyanopyrazole, 1-isopropyl-3-methyl-4-cyanopyrazole, 1-benzyl-3-methyl-4-cyanopyrazole, 1,5-dimethyl-4-cyanopyrazole, 1-isopropyl-4-cyano-5-methylpyrazole, 1-isopropyl-4-cyano-5-hydroxypyrazole, 1-isopropyl-4-cyano-5-chloropyrazole, 1-benzyl-4-cyano-5-methylpyrazole, 1-benzyl-4-cyano-5-hydroxypyrazole, 1-benzyl-4-cyano-5-chloropyrazole, 3,5-dimethyl-4-cyanopyrazole, 3-methyl-4-cyano-5-hydroxypyrazole, 3-methyl-4-cyano-5-chloropyrazole, 1,3,5-trimethyl-4-cyanopyrazole, 1-benzyl-3,5-dimethyl-4-cyanopyrazole, 1,3-dimethyl-4-cyano-5-hydroxypyrazole; pyrazoles having an amino group such as 5-aminopyrazole, 1-methyl-5-aminopyrazole, 1-isopropyl-5-aminopyrazole, 1-benzyl-5-aminopyrazole, 1,3-dimethyl-5-aminopyrazole, 1-isopropyl-3-methyl-5-aminopyrazole, 1-benzyl-3-methyl-5-aminopyrazole, 1-methyl- 4-chloro-5-aminopyrazole, 1-methyl-4-cyano-5-aminopyrazole, 1-isopropyl-4-chloro-5-aminopyrazole, 3-methyl-4-chloro-5-aminopyrazole, 1-benzyl-4-chloro-5-aminopyrazole, and 1,3-dimethyl-4-chloro-5-aminopyrazole; pyrazoles having any two or more amino groups, carboxyl groups, or cyano groups such as 1-methyl-4-carboxymethyl-5-aminopyrazole, 1-isopropyl-4-carboxymethyl-5-aminopyrazole, 1-benzyl-4-carboxymethyl-5-aminopyrazole, 3-methyl-4-carboxymethyl-5-aminopyrazole, 1,3-dimethyl-4-carboxymethyl-5-aminopyrazole, 1-isopropyl-4-cyano-5-aminopyrazole, 1-benzyl-4-cyano-5-aminopyrazole, 3-methyl-4-cyano-5-aminopyrazole, 1,3-dimethyl-4-cyano-5-aminopyrazole, 1-isopropyl-4-cyano-5-carboxymethylpyrazole, 1-benzyl-4-cyano-5-carboxymethylpyrazole, 3-methyl-4-cyano-5-carboxymethylpyrazole, and 1,3-dimethyl-4-cyano-5-carboxymethylpyrazole; pyrazoles having other groups such as 1-methylpyrazole, 1-isopropylpyrazole, 1-benzylpyrazole, 3-methylpyrazole, 5-methylpyrazole, 1,3-dimethylpyrazole, 4-chloropyrazole, 5-hydroxypyrazole, 5-chloropyrazole, 1-methyl-4-chloropyrazole, 1-isopropyl-4-chloropyrazole, 1,5-dimethylpyrazole, 1-methyl-5-hydroxypyrazole, 1-methyl-5-chloropyrazole, 1-isopropyl-5-methylpyrazole, 1-isopropyl-5-hydroxypyrazole, 1-isopropyl-5-chloropyrazole, 1-benzyl-5-methylpyrazole, 1-benzyl-5-hydroxypyrazole, 1-benzyl-5-chloropyrazole, 1,3-dimethyl-4-chloropyrazole, 1-benzyl-3-methyl-4-chloropyrazole, 1,3,5-trimethylpyrazole, 1,3-dimethyl-5-hydroxypyrazole, 1,3-dimethyl-5-chloropyrazole, 1-isopropyl-3-methyl-5-hydroxypyrazole, 1-benzyl-3,5-dimethylpyrazole, 1-benzyl-3-methyl-5-ethylpyrazole, 1-methyl-4-cyano-5-hydroxypyrazole, 1-methyl-4,5-dichloropyrazole, 1-methyl-4-cyano-5-chlordpyrazole, 1-isopropyl-4-chloro-5-methylpyrazole, 1-isopropyl-4-chloro-5-hydroxypyrazole, 1-isopropyl-4,5-dichloropyrazole, 1-benzyl-4-chloro-5-methylpyrazole, 1-benzyl-4-chloro-5-hydroxypyrazole, 1-benzyl-4,5-dichloropyrazole, 3,5-dimethyl-4-chloropyrazole, 3-methyl-4-chloro-5-hydroxypyrazole, 3-methyl-4,5-dichloropyrazole, 1,3,5-trimethyl-4-chloropyrazole, 1-isopropyl-3,5-dimethyl-4-chloropyrazole, and 1,3-dimethyl-4-chloro-5-hydroxypyrazole; or the like.

(3) Triazoles:

1,2,4-Triazole; triazoles having an amino group such as 1-amino-1,2,4-triazole, 2-amino-1,2,4-triazole, 1,2-diamino-1,2,4-triazole, 1-amino-2-hydroxy-1,2,4-triazole, 2,5-diamino-1,2,4-triazole, 2-amino-5-hydroxy-1,2,4-triazole, 1,2,5-triamino-1,2,4-triazole, and 1,2-diamino-5-hydroxy-1,2,4-triazole; triazoles having a thiol group such as 1-mercapto-1,2,4-triazole and 2-mercapto-1,2,4-triazole; triazoles having any two or more amino groups, thiol groups, or carboxyl groups such as 1-amino-2-mercapto-1,2,4-triazole, 1-mercapto-2-amino-1,2,4-triazole, 2-amino-5-mercapto-1,2,4-triazole, 1,2-diamino-5-mercaptotriazole, 1-mercapto-2,5-diamino-1,2,4-triazole, 1-mercapto-2-amino-5-mercapto-1,2,4-triazole, 1-mercapto-2-amino-5-hydroxy-1,2,4-triazole, 1,5-dimercapto-2-amino-1,2,4-triazole, and 3-amino-1,2,4-triazole-5-carboxylic acid; triazoles having other groups such as 2-hydroxy-1,2,4-triazole; or the like.

(4) Triazines:

Triazines having an amino group such as 2-aminotriazine, 2,4-diaminotriazine, and 2,4-diamino-6-[6-[2-(2methyl-1-imidazolyl)ethyl]triazine]; triazines having a thiol group such as 2-anilino-4,6-dimercapto-s-triazine, 2-morpholyl-4,6-dimercapto-s-triazine, 2-monolauryl-4,6-dimercapto-s-triazine, 2,4,6-trimercapto-s-triazine, 2,4,6-trimercapto-s-triazine-monosodium salt, 2,4,6-trimercapto-s-triazine-trisodium salt; and triazines having an amino group and a thiol group such as 2-dibutylamino-4,6-dimercapto-s-triazine; or the like.

Among them, preferred are imidazoles, pyrazoles, triazoles, or triazines having an amino group, thiol group, carboxyl group, or cyano group.

(5) Method of Contact

The method for bringing coordination structure-containing compounds into contact with the surface of a curable resin composition layer is not particularly limited. Examples include (1) a dipping process in which a coordination structure-containing compound is dissolved in water or an organic solvent to prepare a solution, and an inner layer board with a resin composition layer formed thereon is immersed in the solution; and (2) a spray process in which the above described solution is coated by spraying or the like on the surface of a resin composition layer formed on the inner layer board. The operation of the contact may be carried out once or repeatedly two or more times.

The temperature for the contact maybe optionally selected in consideration of the boiling point and melting point of the coordination structure-containing compound or its solution, operability, productivity and the like, and is generally from 10 to 100° C., preferably from 15 to 65° C. The contact time may be optionally selected depending on the amount and solution concentration of the coordination structure-containing compound to be attached to the surface of a molding, productivity and the like, and is generally from 0.1 to 360 minutes, preferably from 0.1 to 60 minutes.

Then, a process of applying inert gas such as nitrogen, or a process of drying in an oven at 30 to 180° C., preferably at 50 to 150° C. for one minute, preferably for 5 to 120 minutes may be carried out for the purpose of removing the excess coordination structure-containing compound. When a conductor circuit is made of a metal such as copper, the drying in an oven may be carried out under nitrogen atmosphere in terms of preventing oxidation. Moreover, the surface of the board may be cleaned by water or an organic solvent prior to these removal operations.

Coordination structure-containing compounds are dissolved for use in solvents as necessary. Solvents to be used are not particularly limited, and may be selected such that curable resin composition layers are not easily dissolved in the solvents, and coordination structure-containing compounds can be dissolved therein. Examples of the solvents include polar solvents such as water; ethers such as tetrahydrofuran; alcohols such as ethanol and isopropanol; ketones such as acetone; cellosolves such as ethyl cellosolve acetate; and mixtures thereof. The concentration of the coordination structure-containing compound in a solution of the coordination structure-containing compound is, but not limited to, generally from 0.001 to 70% by weight, preferably from 0.01 to 50% by weight, in terms of the operability in the present step.

When the coordination structure-containing compound is a liquid in the operating temperature and there is no problem in the operation for bringing the coordination structure-containing compound into contact with the surface of the curable resin composition layer formed in the step 1, it may be used as it is without dissolving in a solvent.

The solution of the coordination structure-containing compound in the present invention is mainly composed of the above described coordination structure-containing compound, and the components other than the coordination structure-containing compound include a surfactant which is used for improving the wetting between the inner layer board with a molding overlapped thereon and the solution of the coordination structure-containing compound, and other additives. The amount of use of these additives is 10% by weight or less, preferably 5% by weight or less, more preferably 1% by weight or less, relative to the coordination structure-containing compound, in terms of ensuring adhesion.

Figure 3:
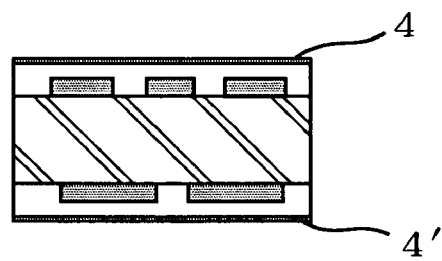
FIG. 3 is a sectional view showing an example of a step of bringing a compound having a structure capable of coordinating to metal atoms or metal ions into contact with the surface of a curable resin composition layer.

FIG. 3 shows a sectional view of an embodiment in which an inner layer board with conductor circuits formed on both sides is used; curable resin composition layers 3 and 3' are formed on both sides thereof; and then compounds 4 and 4' having a structure capable of coordinating to metal atoms or metal ions are brought into contact with the top of them. Although FIG. 3 shows that the coordination structure-containing compounds 4 and 4' form layers, in reality, excess solution is removed and dried, so that instead of forming a physically separated layer, these compounds are finally adsorbed or penetrated around the surface of the curable resin composition layer (mainly penetrated).

The compound having a structure capable of coordinating to metal atoms or metal ions has the effect for improving adhesion even by a small amount. The amount that is penetrated into the curable resin composition layer is preferably from 0.1 µg/m$^2$ to 1 g/m$^2$, more preferably from 10 µg/m$^2$ to 500 mg/m$^2$.

4. Step 3

Following the step 2, the curable resin composition layer is cured to form the electrical insulating layer (b). The curing of the curable resin composition layer is typically carried out by heating the resin composition layer (in reality, the whole inner layer board on which the resin composition layer is formed). Curing conditions are appropriately selected depending on the type of curing agents. The temperature for curing is generally from 30 to 400° C., preferably from 70 to 300° C., more preferably from 100 to 200° C. The time for curing is generally from 0.1 to 5 hours, preferably from 0.5 to 3 hours. The method for heating is not limited, and may be carried out, for example, by using an oven or the like. Typically, for forming multilayer circuit boards, openings for forming via holes are formed in the electrical insulating layer (b) prior to forming a metallic thin film layer in order to connect the conductor circuit (A) of an inner layer board to the conductor circuit (B) to be formed later.

When the openings for forming via holes are formed by photolithography, resists are photo-cured by the masking for forming patterns prior to curing the curable resin composition layer, and then the part that is not cured by light is removed before the above described curing is carried out.

When a process by photolithography is not adopted as the method for forming openings for forming via holes in an electrical insulating layer (b), typically, a resin composition layer is cured to form the electrical insulating layer (b), and then openings for forming via holes are formed by physical treatment such as drilling, laser and plasma etching or the like prior to the next step 4. The method using laser such as carbon dioxide gas laser, excimer laser or UV-YAG laser is preferred, in that it can form finer via holes without reducing the properties of the electrical insulating layer (b).

Figure 4:
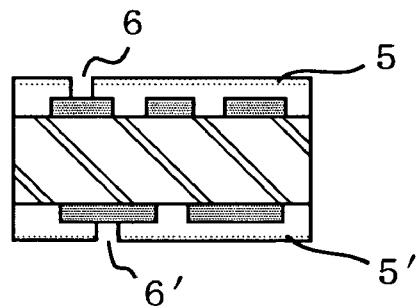
FIG. 4 is a sectional view showing an example of a state of penetration of a compound having a structure capable of coordination after the above described contact treatment and a step of forming via holes.

FIG. 4 shows the state that when a curable resin composition layer is cured, coordination structure-containing compounds 5 and 5' are penetrated around the surface of outer layers. In addition, FIG. 4 shows an example that via holes 6 and 6' are opened.

5. Step 4

The electrical insulating layer (b) for use in step 4 typically has openings 6 and 6' for forming via holes. In step 4, the electrical insulating layer (b) is formed, and then a metallic thin film layer is formed thereon.

Metallic thin film layers 7 and 7' may be formed on the surface of the electrical insulating layer (b) and on the inner wall surface of the openings 6 and 6' for forming via holes by electroless plating, sputtering, vacuum deposition or the like. The method for forming metallic thin film layers is preferably by electroless plating of sputtering.

When a metallic thin film layer is formed by electroless plating, a catalyst core such as silver, palladium, zinc or cobalt is generally adsorbed on an electrical insulating layer prior to forming the metallic thin film layer on the electrical insulating layer (b).

The methods for attaching the catalyst core to the electrical insulating layer (b) include, but not limited to, for example, a method in which the electrical insulating layer (b) is brought into contact with an aqueous alkaline solution such as an aqueous potassium permanganate solution or an aqueous sodium permanganate solution as necessary; subjected to neutralization and reduction by an aqueous acidic solution such as a mixed solution of hydroxyamine sulfate and sulfuric acid or the like; and then immersed in a liquid in which a metallic compound of silver, palladium, zinc, cobalt or the like, or salts or complexes thereof is dissolved in water or in an organic solvent such as alcohol or chloroform in a concentration of 0.001 to 10% by weight (may contain acid, alkali, a complexing agent, reducing agent or the like, as necessary) to reduce metal.

When the electrical insulating layer (b) is formed using a curable resin composition containing an insulating polymer having a weight average molecular weight of 10,000 to 1,000,000, the roughing in the catalyst adsorption treatment prior to forming a metallic thin film layer is highly suppressed, and the electrical insulating layer (b) is substantially not roughened. Here, "substantially not roughened" means that the electrical insulating layer (b) on which the catalyst is adsorbed has a surface roughness Ra in the range from 0.1 nm to 500 nm, preferably from 0.1 nm to 200 nm.

Any of the known autocatalytic electroless plating solution may be used as the electroless plating solution for use in electroless plating. For example, the electroless plating solutions that can be used include an electroless copper plating solution using ammonium hypophosphite or hypophosphorous acid, ammonium borohydride or hydrazine, or formaldehyde as a reducing agent; an electroless nickel-phosphorus plating solution using sodium hypophosphite as a reducing agent; an electroless nickel-boron plating solution using dimethylamine borane as a reducing agent; an electroless palladium plating solution; an electroless palladium-phosphorus plating solution using sodium hypophosphite as a reducing agent; an electroless gold plating solution; an electroless silver plating solution; an electroless nickel-cobalt-phosphorus plating solution using sodium hypophosphite as a reducing agent.

After forming the metallic thin film layer, the surface thereof may be brought into contact with an anti-corrosive agent to undergo anti-corrosive treatment.

For forming the metallic thin film layer by sputtering, plasma treatment in which the surface of the electrical insulating layer (b) is brought into contact with plasma in advance is preferably performed in order to improve adhesion. Neon gas, argon gas, krypton gas, xenon gas, nitrogen gas or the like is used as the inert gas for use in the plasma treatment. Among them, nitrogen gas and/or argon gas is preferred. The methods for generating plasma are not particularly limited, and the inert gas may be introduced into a plasma generating apparatus to generate plasma.

The methods of plasma treatment are not particularly limited, and may be carried out by using a plasma treatment apparatus generally adopted for forming a conductor circuit comprised of metal on an electrical insulating layer. The time required for plasma treatment is, but not limited to, generally from 1 second to 30 minutes, preferably from 10 seconds to 10 minutes. The frequency and output of plasma during the plasma treatment, the gas pressure for generating plasma and the treatment temperature are also not particularly limited, and may be in the range that can be handled in the plasma treatment apparatus. The frequency is typically 13.56 MHz. The output is typically from 50 W to 1,000 W. The gas pressure is typically from 0.01 Pa to 10 Pa. The temperature is typically from 20° C. to 250° C., preferably from 20° C. to 180° C. If the output is too high, the surface of the electrical insulating layer may be cracked. If the gas pressure is too high, the surface smoothness of the electrical insulating layer may be reduced.

The methods of sputtering to be used may include, but not limited to, direct current two-pole sputtering, high frequency sputtering, magnetron sputtering, facing target sputtering, ECR sputtering, bias sputtering, plasma control sputtering, and multi target sputtering. Among them, direct current two-pole sputtering and high frequency sputtering are suitable. The output for sputtering treatment and gas pressure and treatment temperature for generating plasma are not particularly limited, and may be within the range that can be handled by sputtering apparatuses. The output is typically from 10 W to 1,000 W. The gas pressure is typically from 0.01 Pa to 10 Pa. The temperature is typically from 20° C. to 250° C., preferably from 20° C. to 180° C. The rate of film-forming is typically from 0.01 nm/second to 100 nm/second, preferably from 0.1 nm to 10 nm/second. If the film-forming rate is too high, the metallic film formed may be cracked. If the gas pressure is too high, the adhesion may be reduced.

The metallic thin film layer to be formed by the above described sputtering processes may be formed of one type of metal or a plurality of metals. The metallic thin film layer may be one layer or formed by laminating two or more layers. The metals for forming the metallic thin film layer may be any metal such as aluminum, iron, tungsten, molybdenum, tin, nickel, chromium, cobalt, manganese, titanium, copper, silver, gold or platinum.

Preferably another metal than copper, more preferably nickel, chromium, cobalt, manganese, molybdenum, tin, or mixtures thereof is formed on the surface of the electrical insulating layer (b) as the first metallic thin film layer, in that it can obtain excellent adhesion to the electrical insulating layer (b). Most preferably, the second metallic thin film layer comprised of copper is formed on the first metallic thin film layer.

In the present invention, after the metallic thin film layer is formed in step 4 and before step 5, the metallic thin film layer may be heat treated for improving adhesion and the like. The heat treatment may be carried out under pressure.

When the heat treatment is carried out under pressure, the methods for applying pressure include, for example, the use of a heated press machine or a heated press roll machine to physically apply pressure to the board. The pressure to be applied is typically from 0.1 MPa to 20 MPa, preferably from 0.5 MPa to 10 MPa. The heating temperature is typically from 50 to 350° C., preferably from 80 to 250° C. In these ranges, high adhesion can be ensured between the metallic thin film layer and the electrical insulating layer (b).

The thickness of the metallic thin film layer is preferably from 10 nm to 3 µm, more preferably from 15 nm to 1 µm. When the thickness is within these ranges, the metallic thin film layer may be a single layer or multiple layers. When a copper layer is the top layer and a metal layer other than copper is an intermediate metal layer (primary metal layer), the thickness of the intermediate metal layer is preferably from 10 to 500 nm, more preferably from 15 to 300 nm.

Figure 5:
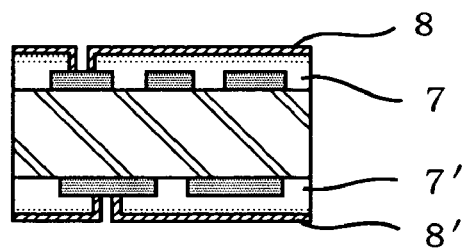
FIG. 5 is a sectional view showing an example of a step of forming a metallic thin film layer.

FIG. 5 shows a sectional view of the embodiment in which the metallic thin film layers 8 and 8' are formed on the electrical insulating layers (b, b') 7 and 7', respectively, on both sides of the inner layer board.

6. Step 5

In step 5, the metallic thin film layer formed in step 4 is utilized to form the conductor circuit (B) on the surface of the electrical insulating layer (b).

Various well known processes in the art or publicly known processes such as a subtractive process, a fully-additive process, and a semi-additive process can be adopted as the method for forming a conductor circuit (conductor pattern) utilizing a metallic thin film layer. Electrolytic plating is generally carried out as a process for forming a metal thickness required for a conductor circuit on a metallic thin film, but a process in which electroless plating is continued may be adopted in some cases.

A method for using electrolytic plating comprises forming resist patterns on the surface of a metallic thin film layer, performing electrolytic plating to form an electroplated metal layer in a pattern form on the surface of the metallic thin film layer, and then removing the resist and subjecting to etching, in turn, to form the conductor circuit (B) on the surface of the electrical insulating layer (b). The conductor circuit (B) formed by this method is generally comprised of a metallic thin film layer and an electroplated metal layer grown thereon.

Figure 6:
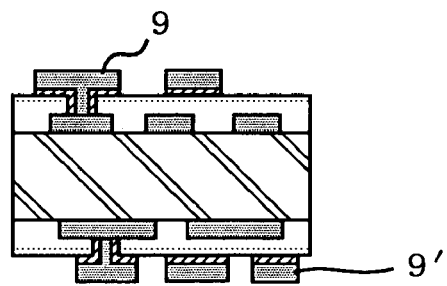
FIG. 6 is a sectional view showing an example of a step of forming a conductive circuit on the surface of an electrical insulating layer utilizing a metallic thin film layer.

FIG. 6 is a sectional view of the embodiment of a multi-layer circuit board comprising conductor circuits (B, B') 9 and 9' formed on both sides of the inner layer board by the above described method.

Other than the above described method, for example, there is a method in which a coordination structure-containing compound is brought into contact with the surface of a curable resin composition layer in a pattern form, and the pattern of the compound is utilized to form a conductor circuit by plating. In this case, the coordination structure-containing compound that is brought into contact with the surface of the curable resin composition layer in a pattern form becomes an initiator pattern, and a metallic pattern can be formed by electroless plating.

Specifically, a conductor circuit (B) is formed on the surface of the electrical insulating layer (b) by i) bringing a compound having a structure capable of coordination into contact with the surface of the curable resin composition layer in a pattern form in step 2, ii) performing electroless plating to deposit metal on the pattern of a compound having a structure capable of coordination on the surface of the electrical insulating layer (b) to form a metallic thin film layer in a pattern form, in step 4, and iii) further performing electroless plating on the metallic thin film layer in a pattern form to increase the thickness of a metal layer, or performing electrolytic plating to form an electroplated metal layer on the pattern of the metallic thin film layer, in step 5. When the pattern is fine, the metal layer is preferably formed only by electroless plating that can provide high pattern accuracy. When the pattern is large, the metal layer is preferably formed by electrolytic plating after forming the metallic thin film layer, in terms of production efficiency.

In this method, it is preferred in terms of adhesion to add the steps for curing a curable resin composition layer to form the electrical insulating layer (b) and then oxidizing the surface of the electrical insulating layer (b), in step 3.

Other than these methods, there is, for example, a method for depositing metal by electrolytic plating or electroless plating on the whole surface of a metallic thin film layer and then performing etching using photolithography technology, remaining the part to be used for a circuit.

7. Other Aspects of Making Multilayers

Above described technologies for making multilayers can be applied not only on one side of an inner layer board but also on both sides thereof. That is, an inner layer board having the electrical insulating layer (a) with conductor circuit layers (A, A') formed on both sides thereof can be used to form the electrical insulating layer (b') and the conductor circuit (B') thereon, also on the other side of the inner layer board so as to cover the conductor circuit layer (A'), by the same steps as step 1 through step 5. FIG. 6 shows a sectional view of an example thereof.

In addition, by repeating the same steps as step 1 through step 5 as desired, two or more layers comprised of a combination of an electrical insulating layer and a conductor circuit can be formed on either one side or both sides of the inner layer board. The upper limit in making multilayers can be appropriately defined as desired, and includes 5 layers or more, 10 layers or more, 50 layers or more, and 70 layers or more.

8. Applications of Multilayer Circuit Board

The multilayer circuit board obtained by the method of the present invention can be used, for example, in electronic equipment such as computers and cellular phones, as a printed wiring board for mounting semiconductor elements such as CPUs and memory, and other mounting components. In particular, those having microscopic wiring are suitable, as high density printed wiring boards, for the wiring boards for high speed computers and portable terminals for use in the high frequency range. Each of the layers may have the same thickness or different thicknesses.

9. Resin Base Material on which Metallic Patterns are Formed

The compound having a structure capable of coordinating to metal atoms or metal ions (coordination structure-containing compound) is adsorbed to a curable resin composition layer and acts as a plating-inducing substance. Therefore, the technology for forming a metallic thin film layer using this compound can be applied to a method for forming metallic patterns by electroless plating on the resin base material formed from the curable resin composition.

Specifically, the method for manufacturing a resin base material on which metallic patterns are formed comprises the steps of: (I) bringing a compound having a structure capable of coordinating to metal atoms or metal ions into contact with the surface of a resin base material formed from a curable resin composition containing an insulating resin and a curing agent in a pattern form; (II) curing the resin base material; and (III) performing electroless plating to deposit metal on the patterns of a compound having a structure capable of coordination on the surface of the resin base material. As for each of the components and materials to be used, those above described can be used.

(1) Resin Base Material:

The shapes of the resin base material may include, but not limited to, a film (sheet), a plate, a cylinder or a sphere. The surface state of the resin base material is not particularly limited, and the surface of the resin base material may be irregular or flat as a whole, as long as the part of the surface in contact with the coordination structure-containing compound to be used as a plating inducing substance is flat in the contact range.

The method for molding a curable resin composition on the resin base material is optionally selected depending on the shape of the resin base material. For example, each of the components composing the curable resin composition is mixed with an organic solvent to obtain varnish. It is coated on a support in a desired thickness and the organic solvent is removed and dried to obtain an uncured or a semi-cured resin base material (molding). In the subsequent step, the support is detached from the resin base material as necessary.

The organic solvent for obtaining the varnish may be optionally selected depending on curable resin compositions, and those having a boiling point at atmospheric pressures of generally from 80 to 250° C., preferably from 90 to 200° C. are selected in terms of the balance of moldability and productivity. Similar methods as the above described method for producing films can be adopted as the method for preparing the varnish and the method for coating the varnish on the support. The conditions for removing and drying the organic solvent after coating the varnish on the support is not particularly limited, but for obtaining a resin base material of a thermoplastic resin composition, the conditions in which it is not completely cured need to be adopted. The conditions are optionally determined in consideration of the types of insulating resins and curing agents and the shape of moldings, and for obtaining a resin base material having a thickness of 0.1 to 150 μm, the organic solvent is generally dried and removed under a heating condition of 20 to 300° C. for 30 seconds to one hour.

(2) Adhering Method:

A preferred method of forming an initiator pattern includes a method for directly adhering a coordination structure-containing compound on the surface of a resin base material in a pattern form. Examples of adhering methods include known adhering methods such as an ink jet system for spraying liquid, a screen printing system for printing via a mask, and a dispenser coating system for directly coating liquid. The adhering operation may be performed once or repeated two or more times.

For adhering, a coordination structure-containing compound is generally dissolved in water or in an organic solvent to be used as a solvent. However, when the compound is in a liquid state at a use temperature and there is no problem in the operation for adhering it in itself on the surface of a resin base material, it may be used as it is without being dissolved in a solvent. As long as the solvent for dissolving the coordination structure-containing compound does not dissolve the resin material and dissolves the coordination structure-containing compound, it is not particularly limited and may be selected from water or various organic solvents which are suitable for the adhering method.

For example, in the ink jet system and screen printing system, polar solvents having a low volatility or solvents having a high (90° C. or higher) boiling point is preferably used for ensuring the work ability in repeated operations. The concentration of the coordination structure-containing compound in a coordination structure-containing compound solution is not particularly limited, and is generally from 0.001 to 70% by weight, preferably from 0.01 to 50% by weight in terms of operability in the present step.

In addition, in order to obtain the viscosity depending on adhering methods, thickeners such as Aerosil or the like may be added for the purpose of imparting thixotropy to the coordination structure-containing compound or its solution.

The temperature in the adhering method may be optionally selected in consideration of the boiling point and melting point of the coordination structure-containing compound and its solution, operability, workability and the like, and is generally from 10 to 100° C., preferably from 15 to 65° C.

After the coordination structure-containing compound is adhered to the surface of the resin base material, post-treatment may be performed for the purpose of removing excess coordination structure-containing compound such as washing of the surface of the resin base material, blowing inert gas such as nitrogen or drying in an oven at 30 to 180° C., preferably at 50 to 150° C. for one minute or more, preferably for 5 to 120 minutes.

The coordination structure-containing compound penetrates around the surface of the resin base material to serve to enhance the interface adhesion between the resin base material and the electroless plating layer.

(3) Curing of the Resin Base Material:

For curing the resin base material, similar conditions as adopted for the above described method for producing multilayer circuit boards can be adopted.

By curing, the resin base material is completely cured to form a resin base material having an initiator pattern on the surface. Conventional method is extremely different from the present invention, in that a plating-inducing substance has been coated on the completely cured resin base material to form the initiator pattern.

By curing the resin base material after the initiator pattern is formed on the surface of the resin base material which is not completely cured, the coordination structure-containing compound to be a plating-inducing substance is incorporated into the surface of the resin base material and the compound is firmly bonded with the resin base material, resulting in enhanced adhesion with the plating to be formed on the resin base material.

According to the method of the present invention, it is unnecessary to form the initiator pattern after the resin base material surface is roughened, and a resin base material having a flat interface to a metallic pattern can be obtained. Here, the flatness refers to a surface roughness Ra of 200 nm or less, preferably 100 nm or less, more preferably 80 nm or less. The surface roughness Ra is the value calculated according to the requirements of JIS B-0601.

(4) Oxidation Treatment:

The use of the coordination structure-containing compound can enhance the crosslinking density of the surface of the resin base material during curing. Consequently, a step for oxidizing the surface of the resin base material, as necessary, can suppress the roughness of the resin base material that is produced at its surface or at the interface with the initiator pattern of the resin base material.

In the curing in this step (II), a brittle layer may be formed on the surface of the resin base material or a contaminant may be adhered to it from a curing atmosphere. So it is preferred to subject the surface of the base material to oxidizing treatment for the purpose of removing them. The method for oxidizing the surface of the base material is not particularly limited, and a method for bringing chemical substances into contact with the surface of the base material, such as a method for using a solution of an oxidizing compound or a method for using a gas medium, is desirable, in that these methods do not roughen the surface of the base material.

Known oxidizing compounds having oxidation capability such as inorganic peroxides or organic peroxides can be used as an oxidizing compound. The inorganic peroxides include permanganates, chromic anhydrides, dichromates, chromates, persulfates, activated manganese dioxide, osmium tetroxide, hydrogen peroxide, periodates, and ozone. The organic peroxides include dicumylperoxide, octanoyl peroxide, m-chloroperbenzoic acid, and peracetic acid.

The methods for oxidizing the surface of the resin base material using an oxidizing compound is not particularly limited, and include general methods such as, for example, a method in which an oxidizing compound is dissolved in a medium that can dissolve it to form a solution, as necessary, and then the solution is brought into contact with the resin base material after cured. Examples of the medium to be used for dissolving the oxidizing compound include a neutral water, an aqueous alkaline solution such as aqueous NaOH solution, an aqueous acidic solution such as aqueous sulfuric acid solution, a neutral organic solvent such as ether or petroleum ether, a polar organic solvent such as acetone or methanol.

The method for bringing the oxidizing compound into contact with the surface of the resin base material is not particularly limited, and maybe any method such as, for example, a dipping process for immersing the resin base material in a solution of the oxidizing compound, a liquid-laying process in which a solution of the oxidizing compound is laid on the surface of the resin base material using surface tension, a spray process for spraying a solution of the oxidizing compound to the resin base material.

The temperature and time for bringing these oxidizing compounds into contact with the surface of the resin base material may be optionally set in consideration of the concentration and type of peroxides, contact methods and the like. The treatment temperature is generally from 20 to 250° C., preferably from 20 to 180° C. The treatment time is generally from 0.5 to 60 minutes, preferably from one minute to 30 minutes. In the ranges lower than the lower limits of these ranges, removal of the brittle layer on the surface of the resin base material produced by curing and the contaminants adhered from a curing atmosphere, after curing, is insufficient. In the ranges higher than the higher limits of these ranges, the surface of the resin base material may be brittle, or the smoothness of the surface may be impaired.

After the oxidizing compound is brought into contact with the surface of the resin base material, the resin base material is generally washed with water for removing the oxidizing compound. When the substance that cannot be washed only by water is adhered to the base material, the substance may be further cleaned with a cleaning solution that can dissolve the substance, or the substance may be brought into contact with other compounds to form a water-soluble substance for washing with water. For example, when an aqueous alkaline solution such as a potassium permanganate solution or a sodium permanganate solution is brought into contact with a resin base material, neutralization and reduction is performed by an acidic solution such as a mixed solution of hydroxyamine sulfate and sulfuric acid for the purpose of removing the formed coating film of manganese dioxide.

The methods of oxidization treatment using a gas medium include known plasma treatment capable of radicalizing or ionizing the medium, such as reverse sputtering or corona discharge. Examples of the gas medium include air, oxygen, nitrogen, argon, water, carbon disulfide, and carbon tetrachloride. When the medium is liquid in a treatment temperature atmosphere, the oxidation treatment is performed after the medium is vaporized under reduced pressure. When the medium is vapor in a treatment temperature atmosphere, the oxidation treatment is performed after the medium is pressurized to the pressure where radicalization or ionization is possible. The temperature and time for bringing plasma into contact with the surface of the resin base material may be optionally set in consideration of the type and the flow rate of the gas. The treatment temperature in this case is generally from 10 to 250° C., preferably from 20 to 180° C., and the treatment time is generally from 0.5 to 60 minutes, preferably from one minute to 30 minutes.

(5) Electroless Plating:

In step (III), electroless plating is performed on the initiator pattern on the resin base material obtained through step (II).

The electroless plating can be performed under the similar conditions as those for the above described method of producing multilayer circuit boards. Generally, such treatment as attaching a plating catalyst or activation of the catalyst is performed prior to the electroless plating. The plating catalyst is a metallic compound that serves as a reducing catalyst for depositing the plating in an electroless plating solution. The metal includes Pd, Pt, Au, Ag, Ir, Os, Ru, Sn, Zn and Co. Organometallic complexes or metal salts capable of producing metals by reduction are preferably used as the metallic compound in order to enhance the adhesion, and specifically include Pd-amine complexes, palladium sulfate and palladium chloride. The above described methods can be adopted as the method for attaching the catalyst and activating it.

Although more catalyst is adsorbed on the initiator pattern (the pattern of a coordination structure-containing compound), it is desired that the catalyst adsorbed to the part without the initiator pattern is removed. Generally, the unnecessary catalyst is removed by washing with water after attaching the catalyst or after activating the catalyst.

Thus, the activated catalyst is attached on the initiator pattern of the resin base material and then brought into contact with an electroless plating solution to perform electroless plating.

The electroless plating solution for use in the electroless plating is not particularly limited, and those described above can be preferably used. In addition, after the electroless plating, the surface of the resin base material can also be brought into contact with an anti-corrosive agent to be subjected to anti-corrosive treatment.

After the metallic pattern is formed on the surface of the resin base material by performing electroless plating, the resin base material is preferably heat treated using an oven or the like at 50 to 350° C., preferably at 80 to 250° C. for 0.1 to 10 hours, preferably for 0.1 to 5 hours in order to improve adhesion. At this time, it is preferable to heat it under an inert gas atmosphere such as nitrogen or argon. Further, the resin base material may be pressurized by a press plate or the like during the heating as necessary.

Through the above described steps, the surface of the resin base material is applied with the electroless plating to obtain the resin base material of the present invention having the metallic patterns on the surface. This resin base material can be used as the printed wiring board and the like for use, for example, in semiconductor device mounting components, various panel display devices, IC cards and optical devices.

10. Resin Base Material on which a Metallic Thin Film is Formed

A resin base material on which a metallic thin film is formed can be obtained by the similar method as the method for producing multilayer circuit boards and the method for producing resin base materials on which metallic patterns are formed, as described above.

Specifically, the method for producing a resin base material on which a metallic thin film is formed comprises the steps of: (i) bringing a compound having a structure capable of coordinating to metal atoms or metal ions into contact with the surface of a resin base material formed from a curable resin composition containing an insulating resin and a curing agent; (ii) curing the resin base material; and (iii) performing electroless plating or sputtering to form a metallic thin film on the surface of the resin base material.

EXAMPLES

The present invention will now be specifically described with reference to examples and comparative examples. Note that "part" and "%" in the examples are based on weight unless otherwise specified.

The evaluation methods performed in the present invention are as follows.

(1) Molecular Weight [Weight Average Molecular Weight (Mw), Number Average Molecular Weight (Mn)]:

The molecular weight was measured as a value in terms of polystyrene by gel permeation chromatography (GPC) using toluene as a solvent.

(2) Hydrogenation Ratio and Maleic Acid (Anhydride) Residue Content:

The ratio of hydrogenation to the number of moles of unsaturated bonds in a polymer before hydrogenation (hydrogenation ratio) and the ratio of the number of moles of maleic acid (anhydride) to the total monomer units in the polymer (carboxyl group content) were measured by $^1$H-NMR spectroscopy.

(3) Glass Transition Temperature (Tg):

Glass transition temperature (Tg) was measured by differential scanning calorimetry (DSC).

(4) Roughness of the Resin Surface:

Surface roughness Ra was measured and evaluated by an atomic force microscope (Nanoscope 3a, made by Digital Instrument) using a Si single crystal strip cantilever (spring constant=20 N/m, length 125 μm) in a tapping mode in air.

(5) Evaluation of a Deposition State of Plating:

The appearance of a substrate of 10 cm square was visually observed after electroless plating. The deposition of plating that was uniform across the substrate was referred to as "good", and occurrence of blisters or peeling, partial deposition, or no deposition was referred to as "poor".

(6) Evaluation of Pattern Adhesion:

A multilayer circuit board which has a square conductor pattern having a side of 5 cm formed on the outer most layer was left standing in an atmosphere of a temperature of 85° C. and a relative humidity of 85% for 30 hours, and then the conductor pattern was cut along the diagonal with a cutter knife having a sharp end. The cut plating layer was visually observed for the peeling and the occurrence of blisters. Those in which no peeling or blisters were observed were referred to as "good", and those in which peeling or blisters were observed were referred to as "poor".

Incidentally, in Examples 8 and 9, the adhesion was evaluated according to the following methods.

A multilayer circuit board having the pattern for evaluating the plating adhesion stipulated in JIS C-5012-8.5 formed on the outer most layer thereof was left standing in an atmosphere having a temperature of 25° C. and a relative humidity of 65% for 24 hours. Then the plating adhesion test was performed according to JIS C-5012-8.5 and the peeling of a plating layer or the occurrence of blisters was visually observed. Those in which no peeling or blisters were observed were referred to as "good", and those in which peeling or blisters were observed were referred to as "poor".

(7) Evaluation of Patterning Characteristics:

One hundred wiring patterns were formed with a wiring width of 30 μm, a distance between wirings of 30 μm and a wiring length of 5 cm, and evaluated as follows: Those in which all of the 100 patterns have no irregularities were referred to as A; those having small irregularities in the shape such as blisters but no deficiency such as peeling were referred to as B; and those having deficiency were referred to as C.

Example 1

1. Formation of a Curable Resin Composition Layer 8-ethyl-tetracyclo[$4.4.0.1^{2,5}.1^{7,10}$]-dodeca-3-ene was subjected to ring-opening polymerization, and the resultant ring-opening polymer was subjected to hydrogenation reaction to obtain a hydrogenated polymer having a number average molecular weight (Mn) of 31,200, a weight average molecular weight (Mw) of 55,800, and Tg of about 140° C. The hydrogenation ratio of the obtained polymer was 99% or higher.

One hundred parts of the obtained polymer, 40 parts of maleic anhydride and 5 parts of dicumyl peroxide were dissolved in 250 parts of t-butylbenzene and were reacted for 6 hours at 140° C. The resultant reaction product solution was added into 1,000 parts of isopropyl alcohol to coagulate the reaction product to obtain amaleic acid-modified hydrogenated polymer. The modified hydrogenated polymer was vacuum dried at 100° C. for 20 hours. The molecular weights of the modified hydrogenated polymer were Mn=33,200 and Mw=68,300, and Tg=170° C. The maleic acid (anhydride) residue content was 25 mol %.

One hundred parts of the above described modified hydrogenated polymer, 40 parts of bisphenol A bis(propyleneglycolglycidylether)ether, 5 parts of 2-[2-hydroxy-3,5-bis(α,α-dimethylbenzyl)phenyl]benzotria zole, and 0.1 part of 1-benzyl-2-phenylimidazole were dissolved in a mixed solvent consisting of 215 parts of xylene and 54 parts of cyclopentanone to obtain a varnish.

The varnish was coated on a polyethylene naphthalate film (carrier film) of 300 mm square and 40 μm thick using a die coater and then dried in a nitrogen oven at 120° C. for 10 minutes to obtain a dry film with a carrier film having a resin thickness of 35 μm.

On the other hand, 0.1% solution of 2-di-n-butylamino-4, 6-dimercapto-s-triazine in isopropyl alcohol was prepared. In this solution, a double-sided copper-clad board (a core material which is obtained by impregnating a glass cloth with a varnish containing a glass filler and an epoxy resin which does not contain halogen) having a thickness of 0.8 mm, in which an inner layer circuit was formed which has a wiring width and a distance between wirings of 50 μm each and a conductor thickness of 18 μm and is treated with microetching on the surface, was immersed for one minute at 25° C., and dried in a nitrogen-purged oven for 15 minutes at 90° C. to form a primer layer.

On the above described inner layer board, the dry film with a carrier film was bonded together on both sides of the double-sided copper clad board such that the resin surface faces inside. This was subjected to thermo-compression bonding as a first press using a vacuum laminator provided with press plates made of a heat resistant rubber at top and bottom, under a reduced pressure of 200 Pa, at a temperature of 110° C. and a pressure of 0.5 MPa for 60 seconds. Then this was subjected to thermo-compression bonding as a second press using a vacuum laminator provided with press plates made of a heat resistant rubber covered with metallic press plates at top and bottom, under a reduced pressure of 200 Pa, at a temperature of 140° C. and a pressure of 1.0 MPa for 60 seconds to laminate the curable resin composition film.

Only the polyethylene naphthalate film, which is a carrier film, was peeled from the inner layer board on which the curable resin composition film is laminated.

2. Contact Treatment by a Coordination Structure-containing Compound

Then, the inner layer board on which the curable resin composition film is laminated was immersed in an aqueous solution which was adjusted so that 1-(2-aminoethyl)-2-methylimidazole is included in 0.1%, for one minute at 25° C., and then excess solution was removed by an air knife.

3. Curing

Next, the inner layer board was left standing in a nitrogen oven at 170° C. for 60 minutes, allowing the curable resin composition layer (film layer) to be cured to form electrical insulating layers on both sides of the inner layer board.

In the obtained electrical insulating layer portions of the laminate, via holes having a diameter of 30 μm for interfacial connection were formed using the third harmonics of UV-YAG laser, obtaining a multilayer board with via holes.

4. Electroless Plating

The above described multilayer board with via holes was immersed in an aqueous solution of 80° C. for 15 minutes which was adjusted so as to have a concentration of permanganic acid of 60 g/liter and a concentration of sodium hydroxide of 28 g/liter. Then, the board was immersed in a water bath for one minute, and further immersed in another water bath for one minute to wash the board with water. Subsequently, the board was immersed in an aqueous solution of 25° C. for 5 minutes which was adjusted so as to have a concentration of hydroxylamine sulfate of 170 g/liter and a concentration of sulfuric acid of 80 g/liter, being subjected to neutralization and reduction treatment, and then washed with water, and the water was removed by blowing nitrogen.

The multilayer board after water washing was immersed in a Pd salt-containing plating catalyst solution of 60° C. for 5 minutes which was adjusted to contain 200 ml/liter of ACTI-VATOR MAT-1-A (made by Uyemura & Co., Ltd.), 30 ml/liter of ACTIVATORMAT-1-B (made by Uyemura & Co., Ltd.), and 1 g/liter of sodium hydroxide. Then, the board was washed with water according to the same procedures as described above, and immersed in a solution at 35° C. for 5 minutes which was adjusted to contain 18 ml/liter of REDUCER MRD-2-A (made by Uyemura & Co., Ltd.) and 60 ml/liter of REDUCER MRD-2-C (made by Uyemura & Co., Ltd.), subjecting the plating catalyst to reduction treatment. The surface of the outer most insulating layer of the multilayer board on which the plating catalyst was adsorbed was evaluated for the roughness in this way, and Ra was found to be 63 nm.

The thus obtained multilayer board was immersed to perform the electroless plating for 15 minutes while blowing air in an electroless plating solution of 36° C. which was adjusted to contain 100 ml/liter of PEA-6-A (made by Uyemura & Co., Ltd.), 100 ml/liter of PEA-6-B (made by Uyemura & Co., Ltd.), 14ml/liter of PEA-6-C (made by Uyemura & Co., Ltd.), 12 ml/liter of PEA-6-D (made by Uyemura & Co., Ltd.), 50 ml/liter of PEA-6-E (made by Uyemura & Co., Ltd.), and 5 ml/liter of 37% form aldehyde aqueous solution. The multilayer board on which metallic thin film layers are formed by the electroless plating was washed with water in the same manner as described above.

Then, the multilayer board was immersed in an anti-corrosive solution at 25° C. for one minute which was adjusted to contain 10 ml/liter of AT-21 (made by Uyemura & Co., Ltd.), washed with water in the same procedures as described above and then dried, applying anti-corrosive treatment. The deposition state of the electroless plating was evaluated.

5. Heat Treatment

The multilayer board which was applied with the anti-corrosive treatment was subjected to heating and pressurizing treatment for 30 minutes by applying a pressure of 3 MPa at 170° C. using a hot press machine.

6. Formation of a Conductor Circuit by Electrolytic Plating

A commercially available dry film of a photosensitive resist was bonded together by thermo-compression bonding on the surface of the multilayer circuit board after the heating and pressurizing treatment. The dry film was brought into intimate contact with a mask having a pattern corresponding to that for evaluating adhesion, exposed and developed to obtain a resist pattern. Next, it was immersed in a solution containing 100 g/liter of sulfuric acid for one minute at 25° C. to remove the anti-corrosive agent, and the portion on which no resist was formed was applied with electrolytic copper plating to form an electrolytic copper plating film having a thickness of 18 μm. Then, the resist pattern was removed with a removing liquid, and etching treatment was performed using a mixed solution of cupric chloride and hydrochloric acid to form a conductor pattern (conductor circuit) comprised of the above described metallic thin film layer and electrolytic copper plating film, obtaining a two-layered multilayer circuit board with conductor patterns on both sides.

The roughness of the surface of the electrical insulating layer in the portion without patterns of the obtained multilayer circuit board was evaluated, and Ra was found to be 78 nm. Moreover, no blisters or peeling was observed in the patterns on the board. The pattern adhesion and patterning characteristics of the thus obtained multilayer circuit board were evaluated. The results are shown in Table 1.

Example 2

The experiments were performed in the same manner as in Example 1, except that 0.1% aqueous solution of 2,4,6-trimercapto-s-triazine-monosodium salt was used as a substitute for 1-(2-aminoethyl)-2-methylimidazole, in the step of contact treatment by a coordination structure-containing compound in Example 1.

The roughness of the surface of an electrical insulating layer that is the outer most layer after subjected to the pre-treatment for plating was evaluated, and Ra was found to be 43 nm. The state of plating deposition after subjected to electroless plating was evaluated.

The roughness of the surface of the electrical insulating layer in the portion without patterns of the obtained multilayer circuit board was evaluated, and Ra was found to be 58 nm. Moreover, no blisters or peeling was observed in the patterns on the board. The pattern adhesion and patterning characteristics of the thus obtained multilayer circuit board were evaluated. The results are shown in Table 1.

Example 3

A varnish was prepared in the same manner as in Example 1 and a multilayer circuit board was manufactured in the same manner as in Example 1, except that 60 parts of poly(2,6-dimethylphenylene-1,4-ether) (Mw=18,000) and 40 parts of an epoxy resin (trade name: Epicoat 1000: made by Yuka-Shell Epoxy Co., Ltd.: Mw=1,300) were used as a substitute for 100 parts of the modified hydrogenated polymer used in Example 1.

The roughness of the surface of an electrical insulating layer that is the outer most layer after subjected to the pre-treatment for plating was evaluated, and Ra was found to be 82 nm. The state of plating deposition after subjected to electroless plating was evaluated.

The roughness of the surface of the insulating layer in the portion without patterns of the obtained multilayer circuit board was evaluated, and Ra was found to be 96 nm. Moreover, no blisters or peeling was observed in the patterns on the board. The pattern adhesion and patterning characteristics of the thus obtained multilayer circuit board were evaluated. The results are shown in Table 1.

Example 4

The treatment was performed in the same manner as in Example 1, except that 0.1% aqueous solution of 3-amino-4-cyanopyrazole was used for the treatment as a substitute for 1-(2-aminoethyl)-2-methylimidazole, in the step of contact treatment by a coordination structure-containing compound in Example 1. The roughness of the surface of an electrical insulating layer that is the outer most layer after subjected to the pre-treatment for plating was evaluated, and Ra was found to be 57 nm. The state of plating deposition after subjected to electroless plating was evaluated.

The roughness of the surface of the electrical insulating layer in the portion without patterns of the obtained multilayer circuit board was evaluated, and Ra was found to be 62 nm. Moreover, no blisters or peeling was observed in the patterns on the board. The pattern adhesion and patterning characteristics of the thus obtained multilayer circuit board were evaluated. The results are shown in Table 1.

Comparative Example 1

A multilayer circuit board was obtained by the same manner as in Example 3, except that the treatment with an aqueous solution of 1-(2-aminoethyl)-2-methylimidazole in Example 3 was eliminated.

The roughness of the surface of the electrical insulating layer in the portion without patterns of the obtained multilayer circuit board was evaluated, and Ra was found to be 21 nm. Moreover, numbers of blisters and peeling having a width of 5 mm or less were observed in the patterns on the board, and further blisters and peeling having a width larger than 5 mm were observed. The results are shown in Table 1.

TABLE 1

| Examples | Plating deposition state | Pattern adhesion | Patterning characteristics |
|---|---|---|---|
| Example 1 | good | good | A |
| Example 2 | good | good | A |
| Example 3 | good | good | A |
| Example 4 | good | good | A |
| Comparative example 1 | poor | poor | C |

Example 5

The obtained varnish in Example 1 was not coated on a carrier film, but was directly coated on the inner layer board having a primer layer formed thereon using a die coater, and subsequently dried in a nitrogen oven for 10 minutes at 120° C. to form a curable resin composition layer having a thickness of 35 μm. A two-layered multilayer circuit board with conductor patterns on both sides was obtained by the same manner as in Example 1, except that it was immersed in an aqueous solution for one minute at 25° C. which was adjusted to contain 0.1% of 1-(2-aminoethyl)-2-methylimidazole.

The roughness of the surface of the electrical insulating layer in the portion without patterns of the obtained multilayer circuit board was evaluated, and Ra was found to be 85 nm. The state of plating deposition and the evaluation of adhesion of the obtained multilayer circuit board were both "good". As for the evaluation of patterning characteristics, blisters in patterns, which were all 5 mm wide or less, caused by the poor in-plane uniformity of the adhesion between the electrical insulating layer and the conductor circuit were observed at three locations.

Example 6

A multilayer board with via holes was obtained by the same procedures as in Example 1. The surface of this multilayer board was subjected to plasma treatment. The conditions of the plasma treatment were as follows: the type of the gas was argon; the conditions of the plasma treatment apparatus included a frequency of 13.56 MHz, an output of 100 W, and a gas pressure of 0.8 Pa; the temperature during treatment was 25° C.; and the time for treatment was 5 minutes. The roughness of the surface of the electrical insulating layer after the plasma treatment was evaluated, and Ra was found to be 50 nm or less.

On the surface of the thus obtained multilayer board which was subjected to plasma treatment after via holes were formed, a chromium film having a thickness of 0.03 μm was formed at a rate of 0.46 nm/second by RF sputtering under an argon atmosphere in the conditions of a frequency of 13.56 MHz, an output of 400 W and a gas pressure of 0.8 Pa, and then a copper thin film having a thickness of 0.3 μm was formed at a rate of 0.91 nm/second.

After the metallic thin film layer was formed on the surface of the multilayer board, a commercially available photosensitive dry film was bonded to the surface by thermo-compression bonding. The dry film was brought into intimate contact with a mask having a predetermined pattern, exposed and developed to obtain a resist pattern. Next, the electrolytic copper plating having a thickness of 35 μm was grown on the portions without resist patterns. Then, the surface of the board on which the copper plating has grown was brought into contact with a releasing liquid to remove the resist patterns, and the sputtering film hidden under the portions where the resist has been formed was removed by a mixed solution of cupric chloride and hydrochloric acid to form a conductor pattern. Finally, it was subjected to annealing for 30 minutes at 170° C. to obtain a multilayer circuit board.

The roughness of the surface of the electrical insulating layer in the portion without patterns of the obtained multilayer circuit board was evaluated, and Ra was found to be 50 nm or less. The pattern adhesion and patterning characteristics of the obtained multilayer circuit board were evaluated, and were found to be "good" and "A", respectively. Further, the peel strength between the electrical insulating layer and the conductor circuit was determined for the multilayer circuit board according to JIS C-6481, and it was found to be 960 gf/cm.

Example 7

A multilayer circuit board was obtained by the same manner as in Example 6, except that the type of gas for plasma treatment was changed to nitrogen. The pattern adhesion and patterning characteristics of the multilayer circuit board were evaluated, and were found to be "good" and "A", respectively. The result of the evaluation of the peel strength was found to be 920 gf/cm. Moreover, the surface roughness Ra both for the electrical insulating layer after plasma treatment and for the electrical insulating layer in the portion without patterns of the obtained multilayer circuit board was evaluated, and was found to be 50 nm or less for both.

Comparative Example 2

A multilayer circuit board was obtained by the same procedures as Example 5, except that the treatment with an aqueous solution of 1-(2-aminoethyl) -2-methylimidazole was eliminated. The surface roughness Ra both for the electrical insulating layer after plasma treatment and for the electrical insulating layer in the portion without patterns of the obtained multilayer circuit board was evaluated, and was found to be 50 nm or less for both, and the patterning characteristics were evaluated as A. However, the pattern adhesion of this multilayer circuit board was poor, and the peel strength was only 650 gf/cm.

From the above results, it can be understood that, when an electrical insulating layer is formed by using a curable resin composition containing an insulating polymer and a curing agent, the treatment of the surface of the curable resin composition layer with a compound having a structure capable of coordinating to metals prior to the curing step for forming the electrical insulating layer provides stable adhesion at the interface between the electrical insulating layer and the conductor circuit and provide good pattern adhesion and patterning characteristics, without roughening the surface of the electrical insulating layer (each Example).

Further, it was found that the formation of metallic thin films by sputtering provides high peel strength (Examples 6 and 7).

On the other hand, when the curable resin composition layer is not surface treated with a compound having a structure capable of coordinating to metals, the adhesion between the electrical insulating layer without roughing and the conductor circuit is poor and the patterning characteristics are reduced (Comparative Examples 1 and 2).

Example 8

1. Formation of a Curable Resin Composition Layer

Curable resin composition layers were formed on both sides of a double-sided copper-clad board in the same manner as in Example 1. Only the polyethylene naphthalate film, which is a carrier film, was peeled from the inner layer board on which the curable resin composition film is laminated. The surface roughness of the curable resin composition layer was evaluated, and Ra was found to be 14 nm.

2. Adhesion of a Coordination Structure-containing Compound in a Pattern Form

Desired wiring patterns were drawn by an aqueous solution which was prepared to contain 0.3% of 1-(2-aminoethyl)-2- methylimidazole as a plating-inducing substance using an ink jet apparatus on the surfaces of the curable resin composition layers laminated on the inner layer board, forming initiator patterns for electroless plating on the surfaces of the molding. This was left standing in a nitrogen oven at 170° C. for 60 minutes, allowing the curable resin composition layers to be cured to form electrical insulating layers which are resin base materials on the inner layer board, obtaining a laminate. Initiator patterns are formed on the surfaces of the laminate.

In the obtained electrical insulating layer portions of the laminate, via holes having a diameter of 30 μm for interfacial connection were formed using the third harmonics of UV-YAG laser, obtaining a multilayer board with via holes.

3. Electroless Plating

As the pre-treatment for plating, the above described multilayer board with via holes was immersed under shaking in an aqueous solution of 80° C. for 10 minutes which was adjusted so as to have a concentration of permanganic acid of 60 g/liter and a concentration of sodium hydroxide of 28 g/liter to oxidize the surface. Then, the board was immersed under shaking in a water bath for one minute, and further immersed under shaking in another water bath for one minute to wash the board with water. Subsequently, the board was immersed in an aqueous solution of 25° C. for 5 minutes which was adjusted so as to have a concentration of hydroxylamine sulfate of 170 g/liter and a concentration of sulfuric acid of 80 g/liter, being subjected to neutralization and reduction treatment, and then washed with water, and the water was removed by blowing nitrogen.

For attaching a plating catalyst, the multilayer board after water washing was immersed in a Pd salt-containing plating catalyst solution of 60° C. for 5 minutes which was adjusted to contain 200 ml/liter of ACTIVATOR MAT-1-A (made by Uyemura & Co., Ltd.), 30 ml/liter of ACTIVATOR MAT-1-B (made by Uyemura & Co., Ltd.), and 1 g/liter of sodium hydroxide. Then, for activating the catalyst, the board was washed with water according to the same procedures as described above, and then immersed in a solution at 35° C. for 5 minutes which was adjusted to contain 18 ml/liter of REDUCER MRD-2-A (made by Uyemura & Co., Ltd.) and 60 ml/liter of REDUCER MRD-2-C (made by Uyemura & Co., Ltd.), subjecting the plating catalyst to reduction treatment. The surface of the outer most insulating layer of the obtained multilayer board on which the plating catalyst was adsorbed was evaluated for the roughness in this way, and the Ra of the portion on which patterns were drawn was found to be 32 nm, and the Ra of the portion on which patterns were not drawn was found to be 29 nm, obtaining about the same Ra values.

The thus obtained multilayer board was immersed to perform the electroless plating for 15 minutes while blowing air in the electroless plating solution of 25° C. which was adjusted to contain 150 ml/liter of THRU-CUP PRX-1-A (made by Uyemura & Co., Ltd.),100 ml/liter of THRU-CUP PRX-1-B (made by Uyemura & Co., Ltd.), and 20 ml/liter of THRU-CUP PRX-1-C (made by Uyemura & Co., Ltd.). The multilayer board on which the metallic pattern is formed in a desired pattern form was obtained by washing with water in the same manner as described above.

4. Formation of a Conductor Circuit

For the purpose of increasing the thickness of the metallic pattern on the multilayer board, it was immersed for 5 hours to perform the electroless plating while blowing air in the high-speed electroless plating solution of 60° C. which was adjusted to contain 80 ml/liter of THRU-CUP ELC-SP-A (made by Uyemura & Co., Ltd.), 20 ml/liter of THRU-CUP ELC-SP-B (made by Uyemura & Co., Ltd.), and 80 ml/liter of THRU-CUP ELC-SP-C (made by Uyemura & Co., Ltd.), and 20 ml/liter of THRU-CUP ELC-SP-D (made by Uyemura & Co., Ltd.), further overlaying the metal on the metallic pattern of 18 μm thick formed previously. The multilayer board on which the metallic pattern is formed in a desired pattern form was obtained by further washing with water in the same manner as described above. Then, the multilayer board was immersed in an anti-corrosive solution at 25° C. for one minute which was adjusted to contain 10 ml/liter of AT-21 (made by Uyemura & Co., Ltd.), washed with water in the same procedures as described above and then dried, applying anti-corrosive treatment.

5. Heat Treatment

The multilayer board which was applied with the anti-corrosive treatment was left standing in an oven of nitrogen atmosphere for 30 minutes at 170° C. to subject to heat treatment to obtain a multilayer circuit board having metallic patterns formed by the electroless copper plating on both sides thereof. The roughness of the surface of the electrical insulating layer (resin base material) in the portion without patterns of the obtained multilayer circuit board was evaluated, and Ra was found to be 31 nm. The patterning characteristics and plating adhesion of the obtained multilayer circuit board were evaluated. The results are shown in Table 2.

Example 9

To 100 parts of an aqueous solution which was adjusted to contain 0.3% of 1-(2-aminoethyl)-2-methylimidazole, 15 parts of AEROJIL RY200 (made by Nippon Aerosil Co., Ltd.) was added for the purpose of imparting thixotropy, and mixed and dispersed at a peripheral speed of 10 m/second using a dissolver to prepare a dispersion.

The experiment was performed in the same manner as in Example 8, except that the above described dispersion was used as a substitute for an aqueous solution which was adjusted to contain 0.3% of 1-(2-aminoethyl)-2-methylimidazole in Example 8 and the apparatus used for drawing the initiator pattern was changed to a screen printer.

The surface of the outer most electrical insulating layer after subjected to the pre-treatment for plating was evaluated for the roughness, and the Ra of the portion on which initiator patterns were printed was found to be 58 nm, and the Ra of the portion on which initiator patterns were not printed was found to be 32 nm, obtaining about the same Ra values.

The roughness of the surface of the electrical insulating layer in the portion without patterns of the obtained multilayer circuit board was evaluated, and Ra was found to be 33nm. The pattern adhesion and patterning characteristics of the obtained multilayer circuit board were evaluated. The results are shown in Table 2.

TABLE 2

| Examples | Adhesion | Patterning characteristics |
| --- | --- | --- |
| Example 8 | good | A |
| Example 9 | good | A |

INDUSTRIAL APPLICABILITY

The present invention provides a method for manufacturing multilayer circuit boards excellent in adhesion of conductor patterns (circuits) to electrical insulating layers. The present invention further provides a method for manufacturing resin base materials on which metallic patterns or metallic thin films are formed, suitable for manufacturing multilayer circuit boards and the like.

The multilayer circuit board obtained by the method of the present invention can be used, for example, in electronic equipment such as computers and cellular phones, as a printed wiring board for mounting semiconductor elements such as CPUs and memory, and other mounting components. The resin base material obtained by the method of the present invention can be used as the printed wiring board and the like for use, for example, in semiconductor device mounting components, various panel display devices, IC cards and optical devices.

The invention claimed is:

1. A method for manufacturing a multilayer circuit board comprising:
   1) step 1 of forming a curable resin composition layer containing an insulating resin and a curing agent on one or both sides of an inner layer board having an electrical insulating layer with a conductor circuit formed on one or both sides thereof, so as to cover said conductor circuit;
   2) step 2 of bringing a compound having a structure capable of coordinating to metal atoms or metal ions into contact with the surface of said curable resin composition layer and removing an excess of said compound from the surface of said curable resin composition layer after said contact of said compound with the surface of said curable resin composition layer, wherein said compound is i) an organic compound having an amino group, a thiol group, a carboxyl group, or a cyano group, ii) a heterocyclic compound having a nitrogen atom, an oxygen atom, or a sulfur atom, or iii) an imidazole, a pyrazole, a triazole, or a triazine having an amino group, a thiol group, a carboxyl group, or a cyano group, wherein said compound is penetrated into the surface of said curable resin composition layer, and wherein the excess of said compound is removed from the surface of said curable resin composition layer whereby no layer of said compound is formed on the surface of said curable resin composition layer;
   3) step 3 of forming an electrical insulating layer by curing said curable resin composition layer, wherein said compound having a structure capable of coordinating to metal atoms or metal ions has penetrated into the surface of the electrical insulating layer and is held within said electrical insulating layer;
   4) step 4 of forming at least one metallic thin film layer on the surface of said electrical insulating layer of step 3; and
   5) step 5 of forming a conductor circuit on the surface of said electrical insulating layer of step 3 utilizing said metallic thin film layer.

2. The manufacturing method according to claim 1, wherein said curable resin composition layer is formed by bonding a film of a curable resin composition containing an insulating resin and a curing agent to the one or both sides of said inner layer board so as to cover said conductor circuit in step 1.

3. The manufacturing method according to claim 1, wherein said curable resin composition layer is formed by coating a solution containing an insulating resin and a curing agent on the one or both sides of said inner layer board so as to cover said conductor circuit in step 1 and then drying the solution.

4. The manufacturing method according to claim 1, wherein the insulating resin for use in step 1 is at least one insulating resin selected from the group consisting of epoxy resins, maleimide resins, (meth)acrylic resins, diallyl phthalate resins, triazine resins, cycloaliphatic olefin polymers, aromatic polyether polymers, benzocyclobutene polymers, cyanate ester polymers, liquid crystal polymers and polyimide resins.

5. The manufacturing method according to claim 1, wherein the insulating resin is an insulating polymer having a weight average molecular weight in the range of 10,000 to 1,000,000.

6. The manufacturing method according to claim 5, wherein said insulating polymer is a cycloaliphatic olefin polymer or an aromatic polyether polymer.

7. The manufacturing method according to claim 1, further comprising a step of forming an opening for forming a via hole before or after curing said curable resin composition layer in step 3.

8. The manufacturing method according to claim 1, wherein the metallic thin film layer is formed by electroless plating in step 4.

9. The manufacturing method according to claim 1, wherein the metallic thin film layer is formed by sputtering in step 4.

10. The manufacturing method according to claim 9, wherein the metallic thin film layer is formed by sputtering after the surface of the electrical insulating layer of step 3 is subjected to plasma treatment.

11. The manufacturing method according to claim 1, wherein the metallic thin film layer has a two-layer structure and is formed by forming an intermediate metallic thin film layer consisting of nickel, chromium, cobalt, manganese, molybdenum, tin, or mixtures of two or more thereof on the surface of said electrical insulating layer of step 3, and by further forming a copper thin film layer on said intermediate metallic thin film layer in step 4.

12. The manufacturing method according to claim 1, further comprising a step of heat treating the metallic thin film layer after said metallic thin film layer is formed in step 4.

13. The manufacturing method according to claim 1, wherein the conductor circuit of step 5 is formed on the surface of said electrical insulating layer of step 3 performing electrolytic plating after forming a resist pattern on said metallic thin film layer to form an electroplated metal layer in a pattern form on the surface of said metallic thin film layer, and then removing the resist and subjecting to etching in turn in step 5.

14. The manufacturing method according to claim 1, wherein the conductor circuit of step 5 is formed on the surface of said electrical insulating layer of step 3 by
   i) bringing the compound having a structure capable of coordination into contact with the surface of said curable resin composition layer in a pattern form in step 2;
   ii) performing electroless plating to deposit metal on the pattern of the compound having a structure capable of coordination on the surface of said electrical insulating layer to form the metallic thin film layer in a pattern form in step 4; and
   iii) further performing electroless plating on the metallic thin film layer in a pattern form to increase the thickness of the metal layer, or performing electrolytic plating to form an electroplated metal layer on the pattern of said metallic thin film layer in step 5.

15. The manufacturing method according to claim 14, further comprising a step of oxidizing the surface of the electrical insulating layer of step 3 after said curable resin composition layer is cured to form said electrical insulating layer in step 3.

16. The manufacturing method according to claim 1, wherein at least two layers comprised of a combination of an electrical insulating layer and a conductor circuit are further formed on either one side or both sides of said inner layer board, by repeating the same steps as step 1 through step 5.

17. A method for manufacturing a resin base material on which a metallic pattern is formed comprising:
  I) step I of bringing a compound having a structure capable of coordinating to metal atoms or metal ions into contact in a pattern form with one or both sides of a resin base material formed from a curable resin composition containing an insulating resin and a curing agent, and removing an excess of said compound from the one or both sides of the resin base material after said contact of said compound with the one or both sides of the resin base material, wherein said compound is i) an organic compound having an amino group, a thiol group, a carboxyl group, or a cyano group, ii) a heterocyclic compound having a nitrogen atom, an oxygen atom, or a sulfur atom, or iii) an imidazole, a pyrazole, a triazole, or a triazine having an amino group, a thiol group, a carboxyl group, or a cyano group, wherein said compound is penetrated into the one or both sides of the resin base material, and wherein the excess of said compound is removed from the surface of said resin base material whereby no layer of said compound is formed on the one or both sides of the resin base material;
  II) step II of curing said resin base material to form a cured resin base material, wherein the compound having a structure capable of coordinating to metal atoms or metal ions has penetrated into the cured resin base material and is held within the cured resin base material; and
  III) step III of performing electroless plating to deposit metal on the pattern of the compound having a structure capable of coordination on the surface of said cured resin base material.

18. The manufacturing method according to claim 17, further comprising a step of oxidizing the surface of said cured resin base material after said resin base material is cured in step II.

19. The manufacturing method according to claim 17, further comprising a step of heat treating said cured resin base material after step III.

20. A method for manufacturing a resin base material on which a metallic thin film is formed comprising:
  i) step i of bringing a compound having a structure capable of coordinating to metal atoms or metal ions into contact with one or both sides of a resin base material formed from a curable resin composition containing an insulating resin and a curing agent, and removing an excess of said compound from the one or both sides of the resin base material after said contact of said compound with the one or both sides of the resin base material, wherein said compound is I) an organic compound having an amino group, a thiol group, a carboxyl group, or a cyano group, II) a heterocyclic compound having a nitrogen atom, an oxygen atom, or a sulfur atom, or III) an imidazole, a pyrazole, a triazole, or a triazine having an amino group, a thiol group, a carboxyl group, or a cyano group, wherein said compound is penetrated into the one or both sides of the resin base material, and wherein the excess of said compound is removed from the surface of said resin base material whereby no layer of said compound is formed on the one or both sides of the resin base material;
  ii) step ii of curing said resin base material to form a cured resin base material, wherein the compound having a structure capable of coordinating to metal atoms or metal ions has penetrated into the cured resin base material and is held within the cured resin base material; and
  iii) step iii of performing electroless plating or sputtering to form a metallic thin film on the surface of said cured resin base material.

* * * * *